United States Patent
Matoba et al.

(10) Patent No.: US 7,489,145 B2
(45) Date of Patent: Feb. 10, 2009

(54) PLASMA PROCESSING SYSTEM

(75) Inventors: Hiroshi Matoba, Osaka (JP); Ryohei Tanaka, Osaka (JP); Shuji Omae, Osaka (JP); Shigeki Amadatsu, Osaka (JP)

(73) Assignee: Daihen Corporation, Osaka (JP)

( * ) Notice: Subject to any disclaimer, the term of this patent is extended or adjusted under 35 U.S.C. 154(b) by 81 days.

(21) Appl. No.: 11/636,389

(22) Filed: Dec. 8, 2006

(65) Prior Publication Data
US 2007/0152678 A1 Jul. 5, 2007

(30) Foreign Application Priority Data
Dec. 14, 2005 (JP) .............................. 2005-360401
Jun. 14, 2006 (JP) .............................. 2006-164522

(51) Int. Cl.
*G01R 27/08* (2006.01)
(52) U.S. Cl. .................... 324/707; 702/60; 702/107; 324/601
(58) Field of Classification Search ................. 324/707, 324/650, 601; 702/85
See application file for complete search history.

(56) References Cited

U.S. PATENT DOCUMENTS

| | | | | |
|---|---|---|---|---|
| 4,356,458 | A * | 10/1982 | Armitage | 333/17.3 |
| 6,449,568 | B1 * | 9/2002 | Gerrish | 702/60 |
| 6,708,123 | B2 * | 3/2004 | Gerrish | 702/60 |
| 6,958,612 | B2 * | 10/2005 | Sakayori | 324/601 |
| 2004/0199350 | A1 * | 10/2004 | Blackham et al. | 702/107 |
| 2005/0234662 | A1 * | 10/2005 | Niedzwiecki et al. | 702/60 |

FOREIGN PATENT DOCUMENTS

JP   10-185960   7/1998

OTHER PUBLICATIONS

Hewlett Packard HP 8753E RF Vector Network Analyzer Technical Specifications, Copyright 1998, Hewlett-Packard Company, printed Feb. 1998.*

* cited by examiner

*Primary Examiner*—Diego Gutierrez
*Assistant Examiner*—Benjamin M Baldridge
(74) *Attorney, Agent, or Firm*—Hamre, Schumann, Mueller & Larson, P.C.

(57) ABSTRACT

A high-frequency measurement unit includes a signal detector for detecting a high-frequency signal, and a calibration coefficient storage for storing calibration coefficients Cmin and Cmax used to calibrate a value Amin detected at the lowest limit frequency fmin and a value Amax detected at the uppermost limit frequency fmax to a proper measurement value Asmin and to a proper measurement value Asmax, respectively. The high-frequency measurement unit further includes a frequency detection unit for detecting a frequency fm of the high-frequency signal, a calibration coefficient calculation unit for calculating a calibration coefficient Cm for the frequency fm, and a calibration unit for calibrating the value Am detected by the signal detector to a proper measurement value Asm by using the calibration coefficient Cm calculated by the calibration coefficient calculation unit.

10 Claims, 13 Drawing Sheets

PLASMA PROCESSING SYSTEM

BACKGROUND OF THE INVENTION

1. Field of the Invention

The present invention relates to a plasma processing system. In particular, the present invention relates to a high-frequency measurement unit and an electrical characteristic adjustment apparatus (for e.g. automatic impedance adjustment) that constitute a plasma processing system.

2. Description of the Related Art

FIG. 7 is a block diagram of a conventional plasma processing system. The plasma processing system is employed for executing an etching process or the like on a work such as a semiconductor wafer or a liquid-crystal substrate. The plasma processing system includes a high-frequency power unit 10, an impedance matching device 20, and a plasma processing unit 30. During the plasma processing, a mismatch of impedance emerges between the high-frequency power unit 10 and the plasma processing unit 30, because of large fluctuation in impedance of the plasma processing unit 30. The impedance matching device 20 serves to eliminate such disadvantage, thereby achieving impedance matching between the high-frequency power unit 10 and the plasma processing unit 30.

For monitoring the fluctuation in impedance, a high-frequency detector may be provided between the impedance matching device 20 and the plasma processing unit 30. The high-frequency detector detects a high-frequency voltage, a high-frequency current and so on.

JP-A-H10-185960 discloses a high-frequency signal-detecting probe, as an example of the high-frequency detector. The high-frequency signal-detecting probe includes an input/output terminal for high-frequency signals, a sensor that detects the high-frequency voltage, a sensor that detects the high-frequency current, an output terminal for detection signals output by those sensors, and a case that accommodates those components. The terminals are constituted of a coaxial connector.

In the case where the impedance matching device 20 and the plasma processing unit 30 shown in FIG. 7 are connected via the coaxial connector, the high-frequency signal-detecting probe can be applied. In some plasma processing systems, however, the impedance matching device 20 and the plasma processing unit 30 are connected via a waveguide for reducing transmission loss, so that the energy is transmitted in a form of an electromagnetic wave. Accordingly, the high-frequency signal-detecting probe cannot be connected to such a plasma processing system. In such a case, a high-frequency measurement unit may be provided instead of the high-frequency signal-detecting probe. The high-frequency measurement unit is attached to a position close to the output terminal inside the impedance matching device 20. The high-frequency measurement unit detects a high-frequency voltage (root mean square value, hereinafter RMS value) V, a high-frequency current (RMS value) I, and a phase difference θ between the high-frequency voltage V and the high-frequency current I.

The impedance Z of the plasma processing unit 30 can be calculated through the following formulas based on the measured values V, I, θ:

$$Z = R + jX, \quad R = (V/I)\cos\theta, \quad X = (V/I)\sin\theta$$

Since the measurement point is close to the input terminal of the plasma processing unit 30, the impedance Z thus calculated may be construed as the impedance of the plasma processing unit 30.

In general, when measuring a physical quantity with a measurement unit that includes a sensor, the measurement unit has to be calibrated. This is because a plurality of sensors of the same type presents, from a strict viewpoint, non-uniform sensitivities. The sensor outputs containing an error have to undergo, prior to being handled as a measured physical quantity, a calibration calculation based on calibration data obtained in advance with respect to each of the sensors, for eliminating the error.

In the plasma processing system also, the calibration calculation is required. For example, when measuring the RMS value V of the high-frequency voltage, a calibration coefficient is acquired in advance of actually activating the plasma processing system. The calibration data is acquired as follows. Firstly, a dummy load is connected instead of the plasma processing unit 30. The dummy load has the same impedance as the characteristic impedance (for example, 50Ω) of the plasma processing system. Then the high-frequency power unit 10 is set to output a predetermined power. Theoretically, the RMS value Va of the voltage obtained upon applying the power thus set to the dummy load is known. Under such state, the high-frequency measurement unit actually measures the RMS value Va' of the voltage. Accordingly, a calibration coefficient Ca (=Va/Va') is acquired based on the theoretical value Va and the voltage value Va' obtained through the measurement with the dummy load. Thus, when actually utilizing the plasma processing unit, a correct voltage value can be obtained by multiplying the measured RMS value of the voltage and the calibration coefficient Ca.

Those conventional plasma processing systems employ a fixed frequency such as 2 MHz or 13.56 MHz. During the plasma processing, however, the transition of status with time of the work or the plasma often provokes fluctuation in impedance of the plasma processing unit 30. To absorb such fluctuation, recently a system has been developed that employs the high-frequency power unit 10 instead of the impedance matching device 20, to achieve the impedance matching. For example, an example of the plasma processing systems that have been put to practical use varies the output frequency of the high-frequency power unit 10 in a fine increment, to match the impedance.

The calibration coefficient has to be acquired according to the frequency. The conventional high-frequency measurement unit only bears the calibration data with respect to the fixed frequency. Accordingly, applying the conventional high-frequency measurement unit as it is to the new system can only lead to deviation of the system frequency from the frequency intended by the calibration coefficient stored in the high-frequency measurement unit. This naturally leads to a measurement error.

A possible solution of the measurement error would be acquiring the calibration coefficient with respect to the entire frequency range settable by the high-frequency power unit 10, and store such calibration coefficients in the unit. In this case, however, a huge number of calibration coefficients have to be acquired, and a much larger storage capacity has to be secured for those coefficients. Besides, the job of acquiring such large calibration coefficient group constitutes a heavy burden in establishing the system.

FIG. 14 illustrates another conventional plasma processing system. The plasma processing system includes a high-frequency power unit 100, an impedance matching unit 200, and a plasma processing unit 300. When performing the plasma processing, the impedance of the plasma processing unit 300 largely fluctuates. The impedance matching unit 200 serves to offset the fluctuation to thereby keep the input impedance Z1, i.e. the impedance at the input terminal 200a on the side of the plasma processing unit 300 generally at 50Ω.

The impedance matching unit 200 includes an input-side detector 201, a control unit 202, variable capacitors VC1, VC2, and an inductor L1. The input-side detector 201 detects a voltage Vi and a current Ii of the input terminal 200a, and a phase difference θi between the voltage Vi and the current Ii, and provides the detected value to the control unit 202. The control unit 202 includes a microcomputer, and calculates the input impedance Z1 based on the received values Vi, Ii, and θi. The control unit 202 adjusts the variable capacitor VC1, VC2 through a predetermined step to set the input impedance Z1 at 50Ω. The variable capacitors VC1, VC2 may include a mechanical adjustment unit for example, so that when an actuator controlled by the control unit 202 moves the adjustment unit the capacitance of the variable capacitors VC1, C2 varies.

Thus, the impedance matching unit 200 varies the capacitance of the variable capacitors VC1, VC2 according to the fluctuation in load impedance ZL, i.e. the impedance of the plasma processing unit 300, thereby matching the input impedance Z1 of the impedance matching unit 200 and the output impedance Zout (50Ω) of the high-frequency power unit 100.

The capacitance range achieved by the variable capacitors VC1, VC2 has a certain limit. Accordingly, there is a limit on the fluctuation range of the load impedance ZL of the plasma processing unit 300 that the impedance matching unit 200 can cope with. Therefore, prior to the actual use of the plasma processing unit 300, it has to be examined under which range of the load impedance ZL the impedance matching unit 200 is capable of achieving the impedance matching.

FIG. 15 illustrates a system that examines the operation of the impedance matching unit 200 for the foregoing purpose. This system employs, instead of the plasma processing unit 300, a dummy load 400 that simulates the load impedance ZL of the plasma processing unit 300.

The dummy load 400 includes an inductor L2, variable capacitors VC3, VC4, and a terminal resistance R1. The variable capacitors VC3, VC4 include a mechanical adjustment unit, so that moving the mechanical adjustment unit causes variation by stages of the capacitance of the variable capacitors VC3, VC4. Varying the capacitance of the variable capacitors VC3, VC4 allows setting the impedance of the dummy load 400 as desired. The terminal resistance R1 has the value of 50Ω that is the same as the characteristic impedance of the system.

The examination of the operation of the impedance matching unit 200 is executed, for example, as follows. Firstly, 40 representative values are selected out of the fluctuation range of the load impedance ZL of the plasma processing unit 300. The impedance of the dummy load 400 is set at one of the 40 values. It is then examined whether the input impedance Z1 intrinsic to the impedance matching unit 200 matches the output impedance Zout of the high-frequency power unit 100. This step is executed with respect to all the 40 values. Such procedure allows examining whether the impedance matching unit 200 is capable of achieving the impedance matching throughout the assumed frequency range. However, such examination takes a significantly long time.

Such procedure further requires that the operation of the dummy load 400 be confirmed in advance of the examination of the operation of the impedance matching unit 200. In other words, in order to set the load impedance ZL of the dummy load 400 at a predetermined value, it has to be checked in advance how the adjustment mechanism of the variable capacitors VC3, VC4 should be moved. Hereinafter, the adjustment status of the variable capacitors VC3, VC4 will be referred to as "adjustment position C3, C4".

The impedance adjustment of the dummy load 400 may be performed as follows. Firstly, the load impedance ZL to be reproduced by the dummy load is determined. Then the dummy load 400 is connected to the impedance measurement unit, and the impedance Z=R+jX of the dummy load 400 is measured. From the measured impedance Z, the real part R and the imaginary part X are led out, and plotted on a Smith chart, to check a shift between the target load impedance ZL and the measured impedance Z. Then the adjustment positions C3, C4 of the variable capacitor VC3, VC4 are varied according to the shift, and then the impedance Z of the dummy load 400 is again measured. The variation of the adjustment position and the measurement of the impedance Z are repeated, until the measured impedance Z enters a tolerance range. Such process can only be performed by experts versed in the relationship between the adjustment positions C3, C4 and the impedance Z.

Referring to the Smith chart shown in FIG. 8, a process of the impedance adjustment of the dummy load 400 will be described. The impedance measured at the beginning is indicated by point A. The target impedance is indicated by point B. Changing the adjustment position C3 of the variable capacitor VC3 by a predetermined amount causes the impedance of the dummy load 400 to move from A to C. Further, changing the adjustment position C4 of the variable capacitor VC4 by a predetermined amount causes the impedance of the dummy load 400 to move from C to D. It is difficult, even for the experts of this operation, to predict how the impedance moves upon changing the adjustment positions C3, C4 of the variable capacitors VC3, VC4. Accordingly, it even takes several hours to perform the impedance adjustment with respect to 40 impedance values. Moreover, the load impedance ZL also fluctuates owing to a shift in adjustment of the variable capacitor caused by switching on or off the dummy load 400, individual difference and deterioration with time of the variable capacitor, as well as to conditions such as a temperature and nature of the cooling water. Therefore, although accurate adjustment positions are once examined and recorded, when the dummy load 400 is employed in a subsequent process the accurately identical impedance cannot be reproduced. Consequently, the impedance setting, which consumes a considerable time, has to be executed immediately before each use of the plasma processing system.

SUMMARY OF THE INVENTION

The present invention has been proposed in view of the above-described situation. It is an object of the present invention to provide a high-frequency measurement unit capable of performing accurate high-frequency measurement with respect to a predetermined frequency range by acquiring a small number of calibration coefficients. Another object of the present invention is to provide an automatic adjustment unit that automatically adjusts an adjustment position of a variable capacitor to facilitate the setting of a target load impedance ZL in a dummy load. Further, still another object of the present invention is to provide an automatic adjustment unit that facilitates the examining, in advance of the actual use of the plasma processing unit, what conditions permit the impedance matching unit to achieve impedance matching.

According to a first aspect of the present invention, there is provided a high-frequency measurement unit for measuring a high-frequency signal in a predetermined frequency range. The high-frequency measurement unit comprises a signal detector that detects the high-frequency signal, and a calibration coefficient storage unit that stores calibration coefficients Cmin and Cmax used for calibrating a value Amin detected at a lower limit frequency fmin of the frequency range and a value Amax detected at an upper limit frequency fmax of the same frequency range to a proper measurement value Asmin and a proper measurement value Asmax respectively. The high-frequency measurement unit further comprises: a frequency detection unit that detects a frequency fm of the high-frequency signal detected by the signal detector; and a calibration coefficient calculation unit that calculates a calibration coefficient Cm for the frequency fm, where this calculation is based on the lower limit frequency fmin, the upper limit frequency fmax, the frequency fm detected by the frequency detection unit, and the calibration coefficients Cmin, Cmax stored in the calibration coefficient storage unit. The high-frequency measurement unit also comprises a measured value calibration unit that calibrates the value Am detected by the signal detector to a proper measurement value Asm, where this calibration is based on the calibration coefficient Cm calculated by the calibration coefficient calculation unit.

Preferably, the calibration coefficient calculation unit may calculate the calibration coefficient Cm by the formula:

$$C_m = C_{min} + (f_m - f_{min})(C_{max} - C_{min})/(f_{max} - f_{min}).$$

Preferably, the high-frequency signal detected by the signal detector may be a high-frequency voltage signal.

Preferably, the high-frequency signal detected by the signal detector may be a high-frequency current signal.

Preferably, the signal detector may include a voltage detection unit for detection of a high-frequency voltage signal and a current detection unit for detection of a high-frequency current signal. The calibration coefficient storage unit may store voltage calibration coefficients Cvmin, Cvmax and current calibration coefficients Cimin, Cimax. The voltage calibration coefficients Cvmin, Cvmax are used for calibrating a detected value Vmin of the high-frequency voltage signal at the lower limit frequency fmin of the frequency range and a detected value Vmax of the voltage signal at the upper limit frequency fmax of the frequency range to a proper measurement value VSmin and a proper measurement value VSmax respectively. Likewise, the current calibration coefficients Cimin and Cimax are used for calibrating a detected value Imin of the high-frequency current signal at the lower limit frequency fmin of the frequency range and a detected value Imax of the high-frequency current signal at the upper limit frequency fmax to a proper measurement value ISmin and a proper measurement value ISmax respectively. The calibration coefficient calculation unit may calculate a voltage calibration coefficient Cvm for the frequency fm detected by the frequency detection unit, where this calculation is based on the lower limit frequency fmin and upper limit frequency fmax of the frequency range, the frequency fm, and the voltage calibration coefficients Cvmin, Cvmax stored in the calibration coefficient storage unit. The calibration coefficient calculation unit may also calculate a current calibration coefficient Cim for the frequency fm based on the lower limit frequency fmin, the upper limit frequency fmax, the frequency fm, and the current calibration coefficients Cimin, Cimax stored in the calibration coefficient storage unit. The measured value calibration unit may calibrate a detected value Vm of the high-frequency voltage signal detected by the voltage detection unit to a proper voltage measurement value VSm, where this calibration is based on the voltage calibration coefficient Cvm calculated by the calibration coefficient calculation unit. The measured value calibration unit may also calibrate a detected value Im of the high-frequency current signal detected by the current detection unit to a proper current measurement value ISm, where this calibration is based on the current calibration coefficient Cim calculated by the calibration coefficient calculation unit.

Preferably, the high-frequency measurement unit of the present invention may further comprise a phase detection unit that detects a phase of the high-frequency signal based on the high-frequency voltage signal detected by the voltage detection unit and the high-frequency current signal detected by the current detection unit. In this embodiment, the calibration coefficient storage unit may further store phase calibration coefficients Cdmin, Cdmax used for calibrating a phase difference θmin at the lower limit frequency fmin and a phase difference θmax at the upper limit frequency fmax to a proper phase difference θSmin and a proper phase θSmax respectively, where the phase differences are detected by the phase detection unit. The calibration coefficient calculation unit may further calculate a phase calibration coefficient Cdm for the frequency fm based on the lower limit frequency fmin, the upper limit frequency fmax, the frequency fm detected by the frequency detection unit, and the phase calibration coefficients Cdmin, Cdmax stored in the calibration coefficient storage unit. The measured value calibration unit may further calibrate a phase difference θm detected by the phase detection unit to a proper phase difference θSm, where this calibration is based on the phase calibration coefficient Cdm calculated by the calibration coefficient calculation unit.

Preferably, the voltage calibration coefficients Cvmin and Cvmax may be average values of a plurality of voltage calibration coefficients acquired by changing an output of the high-frequency signal in a predetermined range. Likewise, the current calibration coefficients Cimin, Cimax may be average values of a plurality of current calibration data acquired by changing an output of the high-frequency signal in the predetermined range, and the phase calibration coefficients Cdmin, Cdmax may be average values of a plurality of phase calibration coefficients acquired by changing an output of the high-frequency signal in the predetermined range.

Preferably, the measurement of the high-frequency signal may be performed with respect to two or more discrete frequency ranges that are apart from each other.

According to the high-frequency measurement unit of the present invention, even when the frequency fm of the high-frequency signal fluctuates in a predetermined range, the calibration coefficient Cm corresponding to the frequency fm is calculated by linear interpolation based on the calibration coefficient Cmin corresponding to the lower limit frequency fmin and the calibration coefficient Cmax corresponding to the upper limit frequency fmax, both coefficients being stored in the calibration coefficient storage unit. Then, by utilizing the calibration coefficient Cm, a detected value Am such as a high-frequency voltage or current signal is adjusted to the proper value ASm. In this manner, it is possible to perform accurate measurement of a high-frequency signal in a predetermined frequency range with use of a small number of calibration coefficients.

According to a second aspect of the present invention, there is provided an electrical characteristic adjustment apparatus that automatically adjusts an electrical characteristic value of a target device to a predetermined target characteristic value, where the target device includes a plurality of circuit elements having a variable electrical characteristic value, a plurality of actuators each associated with a corresponding one of the circuit elements for changing the characteristic value of the corresponding element, and a drive controller for controlling operation of the actuators. The electrical characteristic adjustment apparatus of the present invention comprises: a characteristic value acquisition unit that acquires the characteristic value of the target device through a measurement unit for measuring the electrical characteristic value; a characteristic value variation unit that sets one of the plurality of circuit elements as a variable element and the rest as fixed elements, and that causes the drive controller to change the characteristic value of the variable element in a predetermined range; a circuit element adjustment unit that calculates, through a predetermined formula, an error evaluation value used for evaluating an error between the characteristic value acquired by the characteristic value acquisition unit and the target characteristic value, where this calculation is performed each time the characteristic value of the variable element is changed by the characteristic value variation unit. The circuit element adjustment unit also calculates a characteristic value of the variable element that minimizes the error evaluation value. The electrical characteristic adjustment apparatus also comprises an adjustment control unit that repeats a predetermined process until the characteristic value obtained by the characteristic value acquisition unit falls in a tolerance of the target characteristic value. The predetermined process mentioned above includes the steps of: sequentially switching the plurality of circuit elements into a current variable element, with the characteristic value of the circuit element switched last to a variable element fixed at the characteristic value obtained by the circuit element adjustment unit; causing the characteristic value variation unit to change the characteristic value of the current variable element; and causing the circuit element adjustment unit to perform adjustments of the circuit elements.

With the above arrangements, the electrical characteristic adjustment apparatus is capable of calculating an error evaluation value, or an index indicating the error between a measured impedance of a dummy load and the target impedance, with one of e.g. two variable capacitors of the dummy load fixed while the other kept changing. Then, the electrical characteristic adjustment apparatus adjusts the variable capacitor so that the error evaluation value becomes minimal. Thereafter, the electrical characteristic adjustment apparatus switches the role of the capacitors, i.e., the variable capacitor to be fixed in capacitance and the other capacitor to be varied, and executes the above minimizing adjustment. In this manner, an appropriate impedance is set for the dummy load.

Preferably, the characteristic value variation unit may discretely change the characteristic value of the variable circuit element in a predetermined fluctuation range with the use of a golden section method.

With the above arrangement in the electrical characteristic adjustment apparatus, it is possible to reduce the time required for finding the minimum of the error evaluation value.

Preferably, the characteristic value variation unit may include a range setting unit that sets, when changing the characteristic value of each circuit element switched to the variable element, the fluctuation range in accordance with the previous variation in the characteristic value of the variable element.

With the above arrangement, it is possible to change the adjustment range of a variable capacitor in proportion to the previous adjustment amount of the same variable capacitor. This facilitates effective adjustment.

Preferably, the characteristic value acquired by the characteristic value acquisition unit may be an impedance value of the target device, and the circuit element adjustment unit may be configured to calculate the error evaluation value through the following formula:

$$E = \sqrt{a(R_0 - R)^2 + b(X_0 - X)^2 + c[deviationR]^2 + d[deviationX]^2},$$

where: a, b, c, d: weighting coefficient for evaluation,
R: resistance component of the acquired impedance,
Ro: resistance component of the target impedance,
X: reactance component of the acquired impedance,
Xo: reactance component of the target impedance,
deviationR: deviation of R from the tolerance of Ro, and
deviationX: deviation of X from the tolerance of Xo.

With the above arrangement, when the resistance component R or the reactance component X of the measured impedance deviates from the tolerance of the resistance component Ro or the reactance component Xo of the target impedance, a large error evaluation value is obtained.

Preferably, the target device may be a simulative load including two reactance elements with a variable reactance value for the plurality of circuit elements.

Preferably, the target device may be an impedance matching unit including two reactance elements with a variable reactance value as a plurality of circuit elements. The measurement unit may include, a first power measurement unit for measuring an incident wave power of the impedance matching unit, and a second power measurement unit for measuring a reflected wave power of the impedance matching unit. The circuit element adjustment unit may calculate, through a predetermined formula, a reflection coefficient based on the incident wave power and the reflected wave power obtained by the characteristic value acquisition unit. This circuit element adjustment unit may calculate the characteristic value of the variable element based on an error evaluation value that evaluates the error between the reflection coefficient and a predetermined target reflection coefficient.

The above arrangement enables the electrical characteristic adjustment apparatus to automatically execute the impedance matching.

Further features and advantages of the present invention will become more apparent through detailed description given here below referring to the accompanying drawings.

DETAILED DESCRIPTION OF PREFERRED EMBODIMENT

Preferred embodiments of the present invention will be described below with reference to the accompanying drawings.

Figure 1:
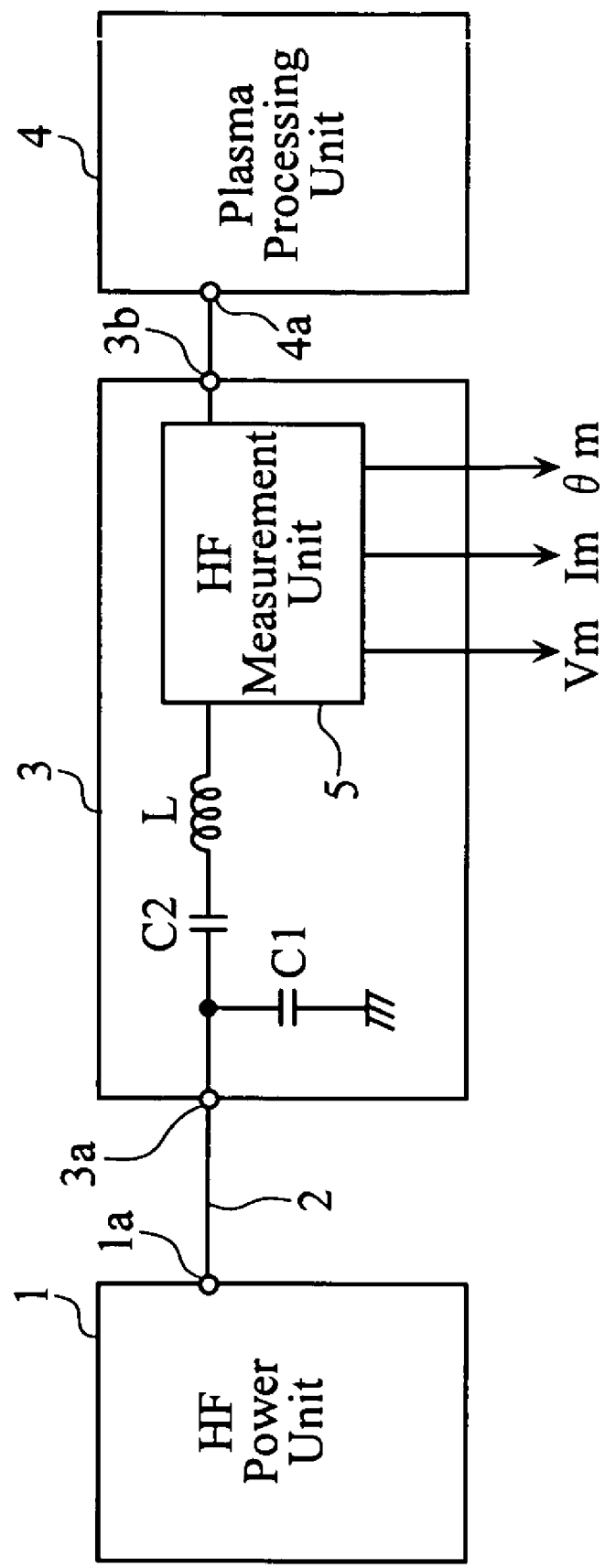
FIG. 1 is a block diagram of a plasma processing system including a high-frequency measurement unit according to the present invention.

FIG. 1 is a block diagram of a plasma processing system including a high-frequency measurement unit according to the present invention. The plasma processing system is employed for executing an etching process or the like, on a work such as a semiconductor wafer or a liquid crystal substrate. The plasma processing system includes a high-frequency power unit 1, a transmission line 2, an impedance matching device 3, and a processing unit 4.

The transmission line 2 is constituted of a coaxial cable, and connects the high-frequency power source 1 and the impedance matching device 3. The impedance matching device 3 is connected to the plasma processing unit 4, which is a load.

The impedance matching device 3 serves to roughly match the impedance of the high-frequency power unit 1 with that of the plasma processing unit 4. The impedance matching device 3 includes capacitors C1, C2 and an inductor L, and the capacitance and inductance of those elements are fixed values. Accordingly, the impedance matching device 3 is not designed to follow up dynamic fluctuation in impedance of the plasma processing unit 4, to thereby match the impedance. Such function is realized, as will be described later, by the high-frequency power unit 1.

The impedance matching performed by the impedance matching device 3 refers to the following operation for example. For the purpose of description, it will be assumed that the plasma processing system is constituted of a 50Ω system. In other words, the values of the foregoing elements are set such that the input impedance of the impedance matching device 3, i.e. the impedance at an input terminal 3a of the impedance matching device 3 on the side of the plasma processing unit 4 becomes generally 50Ω. When the plasma processing is normally executed, the impedance of the plasma processing unit 4 fluctuates time after time, and the fluctuation range is known in advance. Accordingly, the capacitance of the capacitors C1, C2 and the inductance of the inductor L are set such that the representative value of the impedance fluctuation range of the plasma processing unit 4 becomes equal to the input impedance of the impedance matching device.

The high-frequency power unit 1 serves to supply high-frequency power to the plasma processing unit 4. The high-frequency power unit 1 supplies the high-frequency power having a frequency of 2 MHz or 13.56 MHz, which are typically employed in the plasma processing unit 4. Further, the high-frequency power unit 1 is capable of varying the frequency of the high-frequency wave to be output, to follow up the dynamic fluctuation of the impedance of the plasma processing unit 4 thus to achieve the impedance matching. In other words, the output frequency of the high-frequency power unit 1 can be varied in a range of $f=fo\pm\delta f$. Here, fo represents the center frequency, and δf the frequency fluctuation range. More specifically, in the case of fo=2 MHz for example, δf is 0.2 MHz, and when fo is 13.56 MHz, δf is 0.68 MHz.

The impedance matching performed by the high-frequency power unit 1 refers to the following operation for example. For the purpose of description, it will be assumed that the plasma processing system is constituted of a 50Ω system. In this case, the transmission line 2 has characteristic impedance of 50Ω, and an end portion thereof is connected to the input terminal 3a of the impedance matching device 3. The high-frequency power unit 1 varies the output frequency, to match the output impedance of the high-frequency power unit 1, i.e. the impedance at an output terminal 1a of the high-frequency power unit 1 on the side of the plasma processing unit 4, with 50Ω.

The high-frequency measurement unit 5 according to the present invention is provided close to an output terminal 3b of the impedance matching device 3. The high-frequency measurement unit 5 measures a RMS value Vm of the voltage, a RMS value Im of the current, and a phase difference θ between the voltage and the current of the high-frequency signal close to the output terminal 3b, and outputs such values to outside. The values measured at the output terminal 3b may be construed as the measured values at an input terminal 4a of the plasma processing unit 4, because actually the output terminal 3b and the input terminal 4a are directly connected to each other, without any intermediation of a transmission line.

To cope with the possible fluctuation in frequency of the high-frequency power unit 1, the high-frequency measurement unit 5 is capable of measuring the Vm, Im, and θ over a frequency range of 2.0±0.2 MHz and 13.56±0.68 MHz.

When measuring a physical quantity with measurement units, generally the measurement units have to be calibrated, in order to eliminate an error originating from difference in characteristic of the individual measurement units. The calibration may be executed as follows. Prior to the actual measurement, the physical quantity is detected with respect to a reference object (hereinafter, the value obtained at this stage is referred to as a "detected" value). Also, the value that ought to be theoretically detected from that reference object is calculated (hereinafter, the value obtained at this stage is referred to as a "theoretical" value). Based on the detected value and the theoretical value, a calibration coefficient is calculated. Then in the actual measurement, an output of the measurement unit is acquired. Such output undergoes a calculation process such as multiplying the calibration coefficient, to be handled as a properly measured physical quantity (hereinafter, the value obtained at this stage is referred to as a "proper" value).

In the case of the high-frequency measurement unit 5 according to the present invention, only two calibration coefficients, namely those for a lower limit and an upper limit of the frequency fluctuation range are acquired, in advance of the actual use of the plasma processing system. Specifically, when the lower limit of the frequency fluctuation range is denoted by fmin and the upper limit by fmax, the calibration coefficients Cmin, Cmax are allocated in advance to the frequency fmin and fmax respectively, and stored. Here, in the case where the frequency fluctuation range is 2.0±0.2 MHz, fmin is 1.8 MHz, and fmax is 2.2 MHz. When the frequency fluctuation range is 13.56±0.68 MHz, fmin is 12.88 MHz and fmax is 14.24 MHz.

Figure 2:
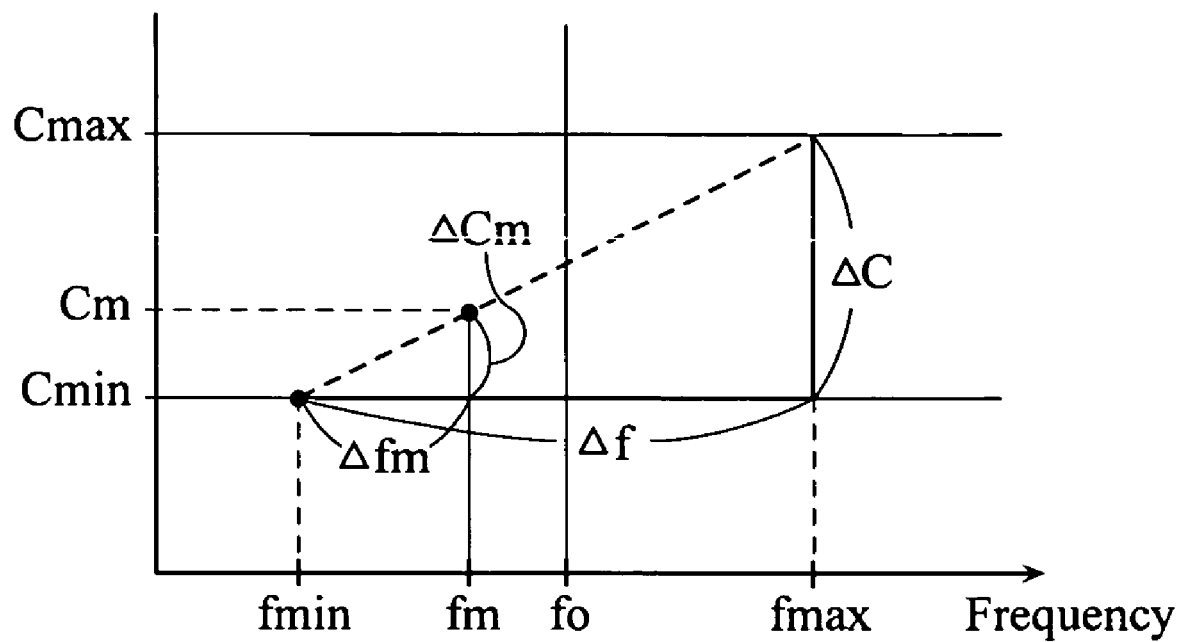
FIG. 2 is a graph for explaining a method of calculating a calibration coefficient based on linear interpolation.

On the other hand, when the plasma processing system is actually in use, the frequency employed in the measurement may differ from fmin or fmax. The calibration coefficient with respect to that frequency is led out by linear interpolation based on the calibration coefficients Cmin and Cmax acquired in advance. Referring now to FIG. 2, the linear interpolation will be described. Since the frequency fluctuation range $\Delta f = fmax - fmin = 2\delta f$ is very narrow, it can be approximated that the calibration coefficient presents a linear transition within such range. Accordingly, a calibration coefficient Cm for a given frequency fm within the frequency fluctuation range can be calculated through the following formula (1):

$$Cm = C\min + \Delta fm \times \frac{\Delta C}{\Delta f} \quad (1)$$

where: $\Delta fm = fm - f\min$;

$\Delta C = C\max - C\min$;

$\Delta f = f\max - C\min$.

The foregoing explanation is a general rule regarding the calibration coefficient. In the present invention, the high-frequency measurement unit 5 handles three types of physical quantities, namely voltage, current, and phase. Accordingly, the calibration coefficients have to be acquired with respect to each of the three types of physical quantities. Specifically, six calibration coefficients are to be acquired in advance, namely a voltage calibration coefficient Cvmin, a current calibration coefficient Cimin, and a phase calibration coefficient Cdmin at the frequency fmin, and a voltage calibration coefficient Cvmax, a current calibration coefficient Cimax, and a phase calibration coefficient Cdmax at the frequency fmax. And the calibration coefficients to be calculated in the actual use of the plasma processing system by the linear interpolation are a current calibration coefficient Cvm, a current calibration coefficient Cim, and a phase calibration coefficient Cdm at the frequency fm.

Further, the high-frequency measurement unit 5 handles the frequency fluctuation range of 2.0±0.2 MHz (hereinafter, "first frequency range W1"), and the frequency fluctuation range of 13.56±0.68 MHz (hereinafter, "second frequency range W2"). Accordingly, the high-frequency measurement unit 5 stores the six calibration coefficients with respect to each of the first frequency range W1 and the second frequency range W2. In the subsequent description, the identification codes of the frequency range such as C1vmin, C2imax, and f1min will be provided only when the values have to be strictly distinguished.

Figure 3:
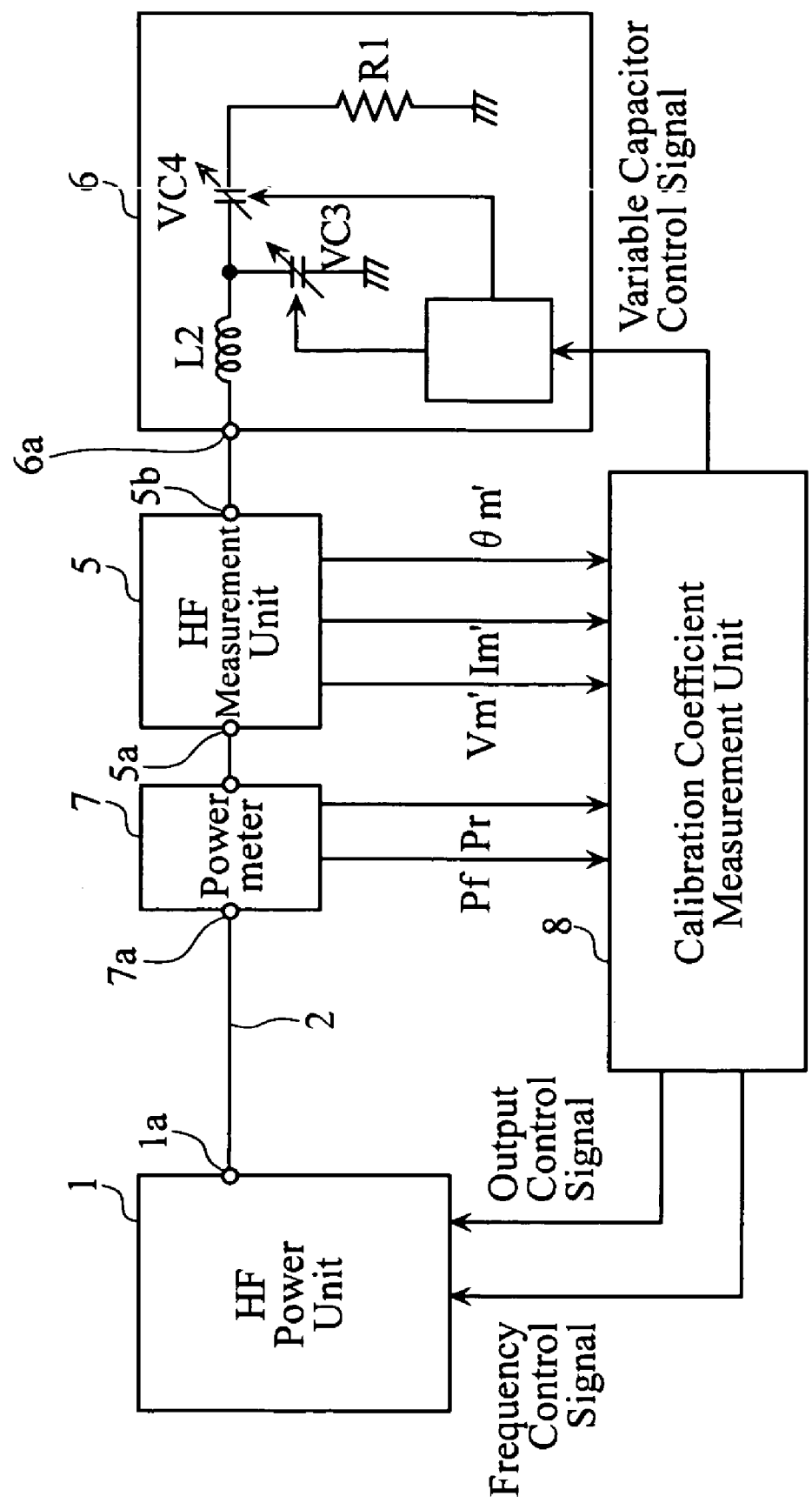
FIG. 3 is a block diagram of a measurement system for acquiring the calibration coefficients Cv, Ci, and Cd.

FIG. 3 is illustrates a measurement system for acquiring the calibration coefficients Cv (i.e. Cvmin or Cvmax), Ci (i.e. Cimin or Cimax), and Cd (i.e. Cdmin or Cdmax). The output terminal 1a of the high-frequency power unit 1 is connected to an input terminal 7a of a power meter 7, via the transmission line 2. The output terminal of the power meter 7 is connected to an input terminal 5a of a high-frequency measurement unit 5. An output terminal 5b of the high-frequency measurement unit 5 is connected to an input terminal 6a of a dummy load 6. A calibration coefficient measurement unit 8 including a personal computer and so on controls the high-frequency power unit 1, the high-frequency measurement unit 5, the dummy load 6, and the power meter 7.

Initially, in the high-frequency measurement unit 5 the calibration coefficients Cv, Ci, Cd are set at 1, 1, 0 respectively, as initial values. Accordingly, the voltage RMS value Vm', the current RMS value Im', and the phase difference θm' that have been measured are input to the calibration coefficient measurement unit 8 as they are.

The dummy load 6 simulatively generates the characteristic impedance Ro of the plasma processing system, and terminates the output terminal 5b of the high-frequency measurement unit with the characteristic impedance Ro. In this embodiment, Ro is 50Ω. The dummy load 6 includes an inductor L2 and variable capacitors VC3, VC4 connected in a T-shape. The variable capacitor VC4 is terminated with a resistance R1 of 50Ω, which is equal to the characteristic impedance of the measurement system.

The capacitance C3, C4 of the variable capacitors VC3, VC4 can be varied by stages. Varying the capacitance C3 and C4 enables changing the impedance of the dummy load 6.

The values of the capacitance C3, C4 that allow setting the impedance of the dummy load 6 with respect to each frequency in the measurement condition are calculated in advance. The calibration coefficient measurement unit 8 stores a table indicating the relationship between the adjustment positions of the variable capacitors VC3, VC4 that provide such values of the capacitance C3, C4, and the frequency. The calibration coefficient measurement unit 8 controls the output frequency of the high-frequency power unit 1 to adjust the output frequency to the frequency to be used for the measurement. Further, the calibration coefficient measurement unit 8 outputs the adjustment position data of the variable capacitors VC3, VC4 corresponding to that frequency to the dummy load 6, thereby setting the impedance of the dummy load 6 at 50Ω.

The power meter 7 serves to measure an incident wave power Pf from the high-frequency power source 1 and a reflected wave power Pr from the dummy load 6. The power meter 7 includes a directional coupler and a detector. The directional coupler separates the incident wave and the reflected wave. The detector detects power of the incident wave and the reflected wave output by the directional coupler. The Pf and Pr thus measured are transmitted to the calibration coefficient measurement unit 8.

The high-frequency power unit 1 receives as an input a frequency control signal and an output voltage control signal from the calibration coefficient measurement unit 8, and outputs a high-frequency signal based on those input signals.

The calibration coefficient measurement unit 8 automatically measures the voltage calibration coefficient C1vmin, the current calibration coefficient C1imin, and the phase calibration coefficient C1dmin at the lower limit frequency f1min, as well as the voltage calibration coefficient C1vmax, the current calibration coefficient C1imax, and the phase calibration coefficient C1dmax at the upper limit frequency f1max, with respect to the first frequency range W1. The calibration coefficient measurement unit 8 also automatically measures the voltage calibration coefficient C2vmin, the current calibration coefficient C2imin, and the phase calibration coefficient C2dmin at the lower limit frequency f2 min, as well as the voltage calibration coefficient C2vmax, the current calibration coefficient C2imax, and the phase calibration coefficient C2dmax at the upper limit frequency f2max, with respect to the second frequency range W2.

The specific process of the automatic measurement is as follows. Firstly the calibration coefficient measurement unit 8 selects a frequency out of the frequencies f1min, f1max, f2 min, and f2max, and adjusts the impedance of the dummy load 6 to 50Ω at the selected frequency. Then the calibration coefficient measurement unit 8 varies the power of the high-frequency signal to be output, for example from 300 W to 2000 W in 18 steps at 100 W increments. In this process, voltage calibration coefficients Cv(1) to Cv(18), current calibration coefficients Ci(1) to Ci(18), and phase calibration coefficients Cd(1) to Cd(18) are respectively acquired, in each step. The 18 calibration coefficients are then averaged, to calculate the voltage calibration coefficient, the current calibration coefficient, and the phase calibration coefficient. Such process is performed with respect to all the four frequencies, namely f1min, f1max, f2 min, and f2max.

Calculation of the voltage calibration coefficient C1vmin at the frequency f1min will be described below as an example. The calibration coefficient measurement unit 8 adjusts the dummy load 6, such that the impedance at the frequency f1min becomes 50Ω. Then the calibration coefficient measurement unit 8 varies the high-frequency signal output from Pmin=300 W to Pmax=2000 W, detecting the voltage RMS value Vm'output by the high-frequency measurement unit 3 at each step. Further, the calibration coefficient measurement unit 8 calculates the voltage RMS value Vm based on the incident wave power Pf and the reflected wave power Pr output by the power meter 7, through the following formula (2):

$$V_m = \sqrt{(P_f - P_r)R_o} \quad (2)$$

where (Pf−Pr) represents the power input to the dummy load 6, and Ro the resistance (50Ω) of the dummy load 6.

Since the power meter 7 is located close to the high-frequency measurement unit 5, the output of the power meter 7 may be regarded as the measured value at the measurement point 5a of the high-frequency measurement unit 5.

Figure 4:
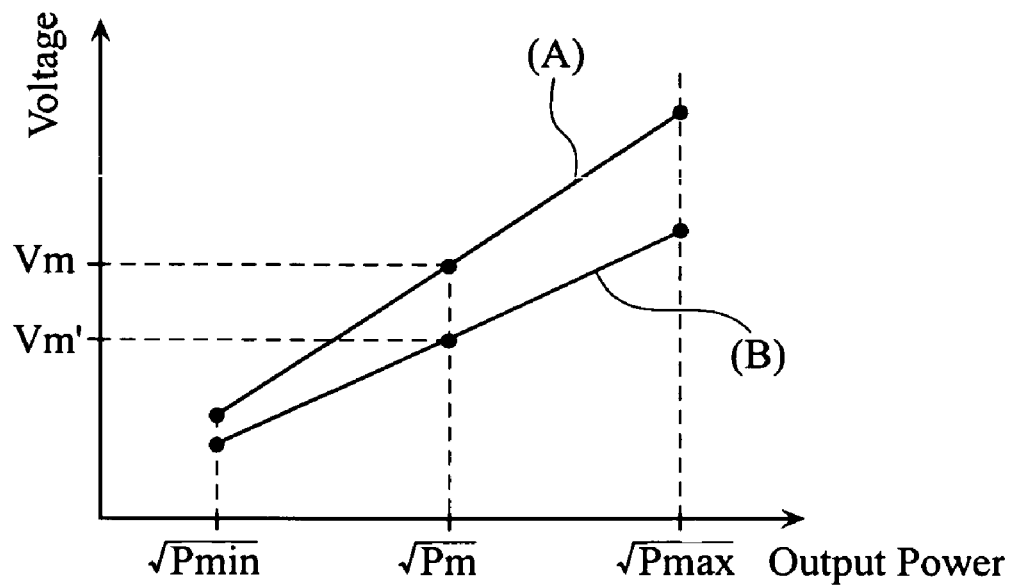
FIG. 4 is a graph showing a RMS value of a voltage detected by a voltage detector, and a RMS value of a voltage calculated from an incident wave power and a reflected wave power.

FIG. 4 indicates the output characteristics of the theoretical voltage RMS value Vm and the detected voltage RMS value Vm'. A line (A) represents the output characteristic of the theoretical voltage RMS value Vm, which is calculated from the incident wave power Pf and the reflected wave power Pr obtained when the high-frequency power unit 1 outputs Pm. A line (B) represents the output characteristic of the detected voltage RMS value Vm', acquired directly from the voltage detector. The theoretical voltage RMS value Vm is a value presumed to be the true voltage RMS value at the measurement point 5a. In contrast, the detected voltage RMS value Vm'is a value directly detected. Accordingly, the difference between these values may be construed as an error originating from fluctuation in sensitivity of the detector.

The voltage calibration coefficient C1min is employed for calibrating the voltage RMS value Vm'detected by the high-frequency measurement unit 5 to a proper voltage RMS value. The output Pm is varied in 18 steps such as 300 W, 400 W, . . . 2000 W, and the voltage calibration coefficient is acquired at each step, i.e. C1(n)=Vm/Vm' is acquired. The acquired 18 values are averaged, to set the voltage calibration coefficient C1vmin=C1v(1)+C1v(2)+C1v(3) . . . +C1v(18)/18 at the frequency f1min.

Likewise, the voltage calibration coefficients C1vmax, C2vmin, C2vmax are set, at the frequency f1max, f2 min, f2max respectively.

Here, when the output P of the high-frequency signal is assumed to be a fixed value, the voltage calibration coefficients C1vmin, C1vmax, C2vmin, and C2vmax may be acquired at the fixed output P. However, when the output fluctuates as in this embodiment, it is preferable to acquire the voltage calibration coefficients according to the magnitude of the output. Nevertheless, acquiring the voltage calibration coefficients where the fluctuation in output does not make significant difference in voltage calibration coefficient leads to an undue increase in number of data to be acquired. Accordingly, it is preferable to obtain the average of the voltage calibration coefficients with respect to a plurality of outputs, and to set that value as the voltage calibration coefficient at the relevant frequency.

To calculate the current calibration coefficient C1imin at the frequency f1min, the calibration coefficient measurement unit 8 calculates the current RMS value Im from the incident wave power Pf and the reflected wave power Pr output by the power meter 7, through the following formula (3):

$$I_m = \sqrt{(P_f - P_r)/R_o} \quad (3)$$

Figure 5:
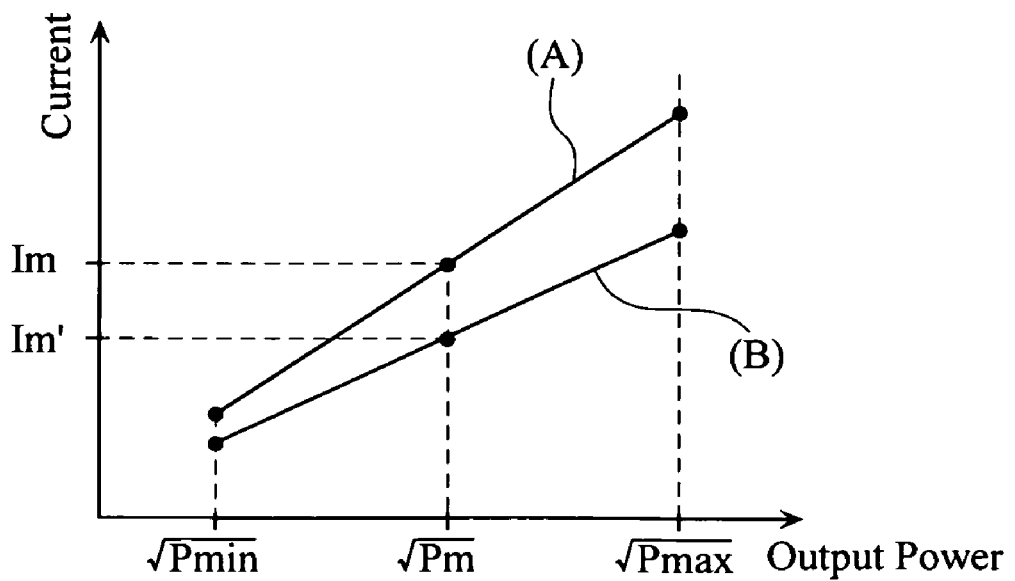
FIG. 5 is a graph showing a RMS value of a current detected by a current detector, and a RMS value of a current calculated from the incident wave power and the reflected wave power.

FIG. 5 indicates the output characteristic of the theoretical current RMS value Im and the detected current RMS value Im'. A line (A) represents the output characteristic of the theoretical current RMS value Im, which is calculated from the incident wave power Pf and the reflected wave power Pr. A line (B) represents the output characteristic of the detected current RMS value Im', acquired directly from the current detector.

The current calibration coefficient C1imin is employed for calibrating the detected value Im' of the current RMS value of the high-frequency measurement unit 5 to a true current RMS value Im. The output Pm is varied in 18 steps such as 300 W, 400 W, 2000 W, and the current calibration coefficient C1(n)= Im/Im' is acquired at each step. The acquired 18 values are averaged to set the current calibration coefficient C1imin at the frequency f1min such that C1imin=C1i(1)+C1i(2)+C1i (3) . . . +C1i(18)/18.

Likewise, the current calibration coefficients C1imax, C2imin, C2imax are set, at the frequency f1max, f2 min, f2max respectively. Further, the phase calibration coefficients C1dmin, C1dmax, C2dmin, and C2dmax are similarly set at the frequency f1min, f1max, f2 min, and f2max respectively. It is for the same reason as described above regarding the voltage calibration coefficient, that the current calibration coefficient and the phase calibration coefficient are set at the average value of the 18 calibration coefficients for different outputs.

Figure 6:
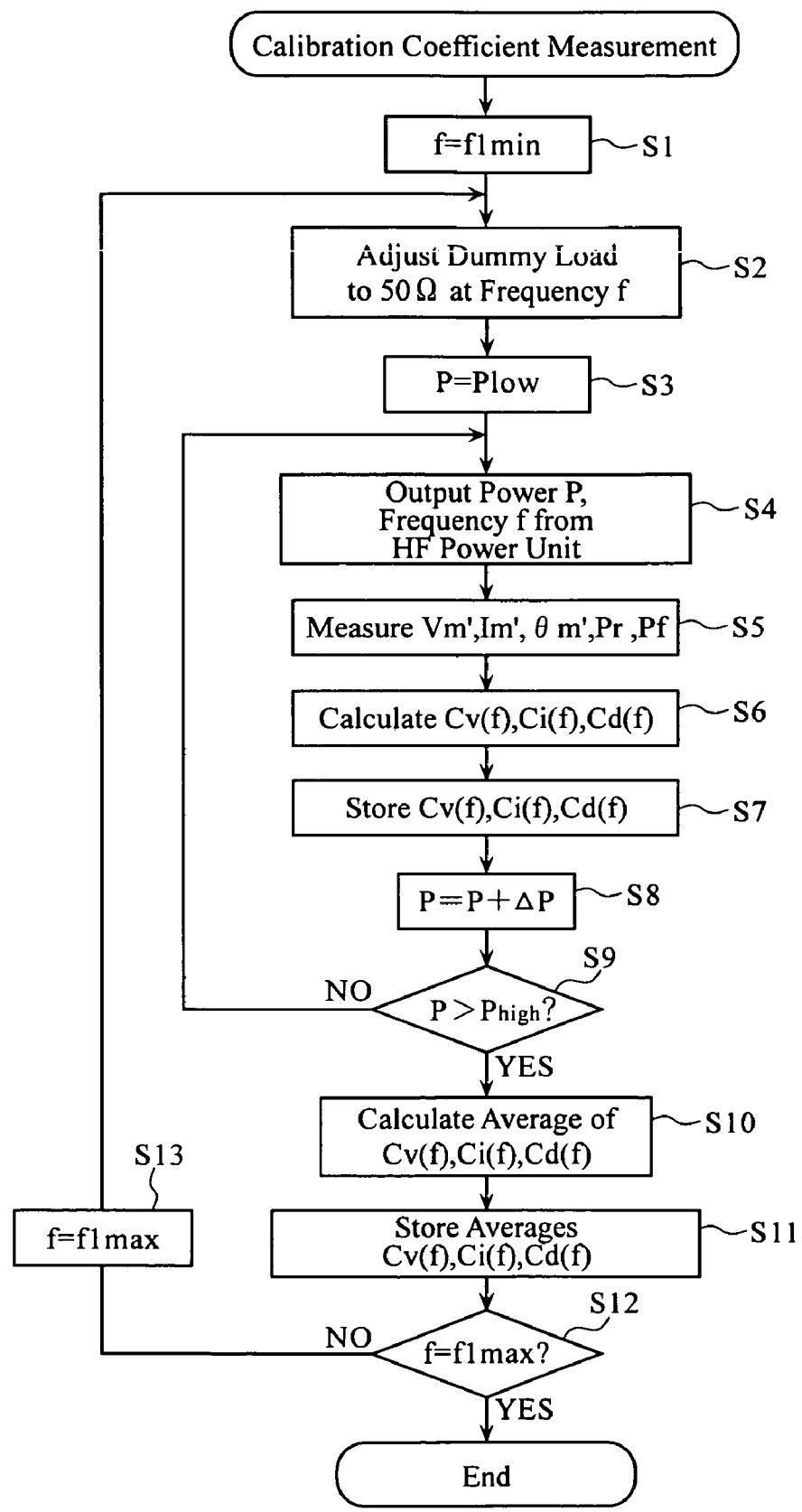
FIG. 6 is a flowchart showing an acquisition process of the calibration coefficient performed in the measurement system shown in FIG. 3.
Figure 7:
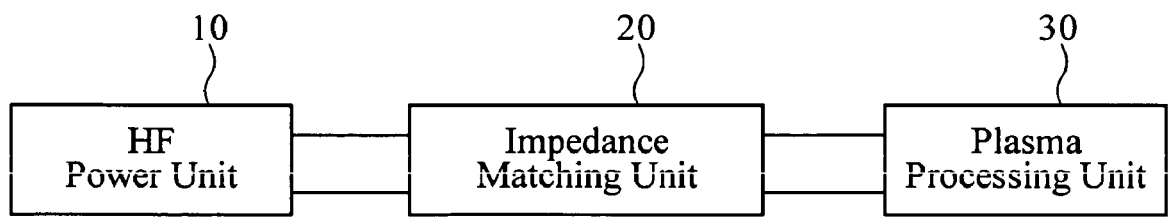
FIG. 7 is a block diagram of a typical plasma processing system.
Figure 8:
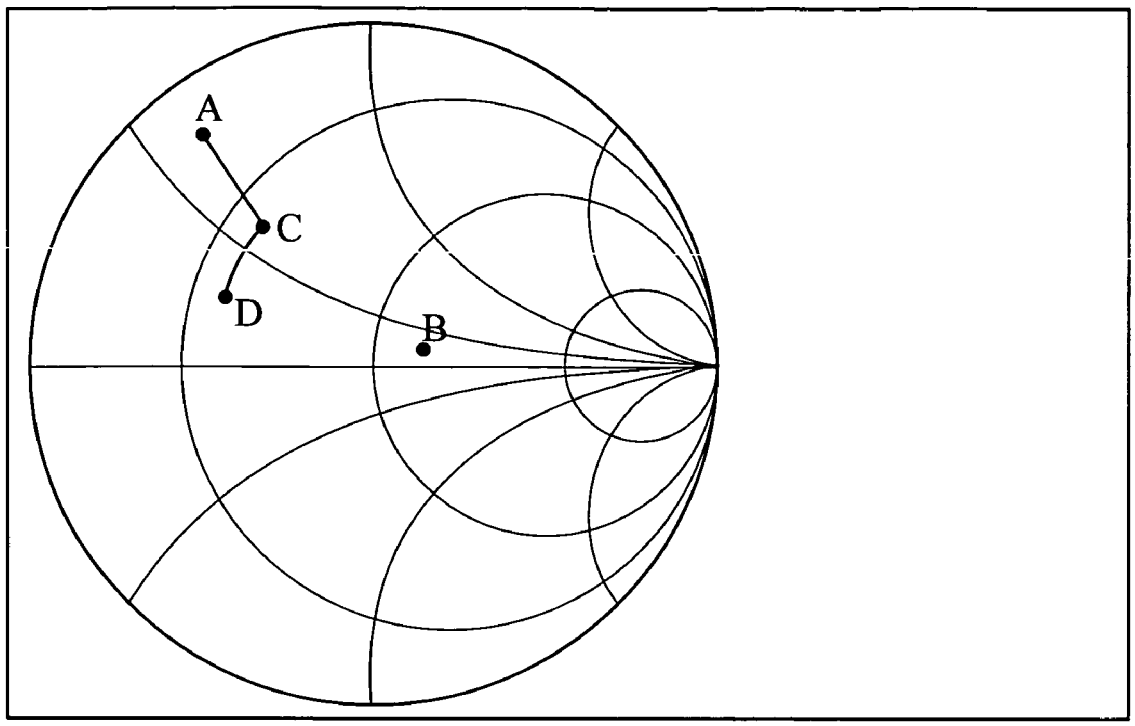
FIG. 8 is a Smith chart for executing an impedance adjustment.

FIG. 6 is a flowchart showing an acquisition process of the calibration coefficient. Based on FIG. 6, description will be given on the acquisition of the calibration coefficient at the lower limit frequency f1min and the upper limit frequency f1max of the first frequency range W1. In the following description, a minimal value of variation range of the power P output by the high-frequency power unit 1 will be denoted by Plow (300 W), a maximal value Phigh (2000 W), and the increment by ΔP (100 W).

Firstly the output frequency f is set at the lower limit frequency f1min in the first frequency range W1 (S1). Then the dummy load 6 is adjusted to present the impedance of 50Ω at the frequency fmin (S2). The output P is set at the minimal power Plow (S3).

Then the high-frequency power unit 1 outputs a high-frequency power having a frequency of f1min and an output of Plow (S4). The high-frequency measurement unit 5 measures the voltage RMS value Vm', the current RMS value Im', and the phase RMS value θm', and the power meter measures the incident wave power Pf and the reflected wave power Pr (S5).

The voltage calibration coefficient Cv, the current calibration coefficient Ci and the phase calibration coefficient Cd for the high-frequency power having the frequency of f1min and the output of Plow are calculated (S6). The calculation results are stored in a memory of the calibration coefficient measurement unit 8 (S7).

The voltage calibration coefficient Cv can be calculated through the following formula:

$$C_v = V_m/V'_m,$$

$$V_m = \sqrt{(P_f-P_r)R_o} = \sqrt{50(P_f-P_r)} \ (\because R_o = 50).$$

The current calibration coefficient Ci can be calculated through the following formula:

$$C_i = I_m/I'_m,$$

$$I_m = \sqrt{(P_f-P_r)/R_o} = \sqrt{(P_f-P_r)/50}.$$

The phase calibration coefficient Cd can be calculated through the following formula:

$$C_d = \theta_m - \theta'_m = -\theta'_m \text{ (Since Ro is 50, the reactance component } \theta m \text{ is 0)}.$$

The output P is increased by ΔP (S8). It is decided whether the increased output P exceeds the maximal output Phigh (S9). In the case of P≦Phigh (S9: NO), the process returns to the step S4, so that the voltage calibration coefficient Cv, the current calibration coefficient Ci, and the phase calibration coefficient Cd are calculated for the high-frequency power having the output of Plow+ΔP (S4 to S7).

Thereafter, the coefficients are calculated each time the output P is increased by ΔP (S4 to S9). When P exceeds Phigh (S9: YES), the average of the voltage calibration coefficients Cv with respect to each of the outputs Plow, Plow+ΔP, Plow+2ΔP, Phigh stored in the memory is calculated (S10), and such average value is stored in the memory as the voltage calibration coefficient C1vmin at the lower limit frequency f1min (S11). Likewise, the average of the current calibration coefficients Ci, and the average of the phase calibration coefficients Cd are calculated (S10), and each of such average values is stored in the memory as the current calibration coefficient C1imin and the phase calibration coefficient C1dmin, at the lower limit frequency f1min.

Then it is decided whether the frequency output f is set as the upper limit frequency f1max in the first frequency range W1 (S12). In the negative case (S12: NO), the output frequency is set as the upper limit frequency f1max (S13), and the process returns to the step S2. Similar steps are then repeated. Thus, the voltage calibration coefficient C1vmax, C1imax, and the phase calibration coefficient C1dmax at the upper limit frequency f1max are calculated, and stored in the memory (S2 to S11).

After the C1vmin, C1vmax, C1imin, C1imax, C1dmin, and C1dmax are acquired through the foregoing steps, the calibration coefficients (Cv=Ci=1, Cd=0) stored in the high-frequency measurement unit 5 are substituted with the acquired values. At this stage, the high-frequency measurement unit 5 is set ready for performing proper measurement.

Referring back to FIG. 1, a measurement operation of the high-frequency measurement unit 5 in the plasma processing system will be described below.

The high-frequency power unit 1 supplies high-frequency power to the plasma processing unit 4 via the transmission line 2 and the impedance matching device 3, to thereby execute the plasma processing. In this process, a high-frequency signal at the load terminal 3b is input to the high-frequency measurement unit 5 in the impedance matching device 3.

The RMS value Vm' of the high-frequency voltage, the RMS value Im' of the high-frequency current, the phase difference θm' between the high-frequency voltage and the high-frequency current, and the frequency fm of the high-frequency signal are detected. Then the voltage calibration coefficient Cvm, the current calibration coefficient Cim, and the phase calibration coefficient Cdm at the frequency fm are calculated through the foregoing formula (1).

The product of the detected RMS value Vm' of the high-frequency voltage and the voltage calibration coefficient Cvm, Vm=Cvm·Vm' is output as the properly measured voltage RMS value. The product of the detected RMS value Im' of the high-frequency current and the current calibration coefficient Cim Im=Cim·Im' is output as the properly measured current RMS value. The sum of the detected phase difference θm' and the phase calibration coefficient Cdm θm=Cdm+θm' is output as the properly measured phase difference.

With the high-frequency measurement unit 5 according to this embodiment, as already stated, the calibration coefficients Cmin and Cmax are acquired in advance at only two frequencies fmin and fmax. The calibration coefficient Cm at a given frequency fm is calculated by linear interpolation between Cmin and Cmax. This allows executing the measurement with a fewer number of calibration coefficients. Accordingly, the burden of the operation of acquiring the calibration coefficients can be significantly alleviated, and besides the calibration coefficients can be quickly acquired.

The high-frequency measurement unit 5 does not contain the actually measured calibration coefficient Cm with respect to a given frequency fm in the measurement frequency range. Accordingly, the accuracy of the calibration may not be extremely high. However, the calibration accuracy can be easily proven by the following method. Firstly, the measurement of the calibration coefficient is performed. Then the high-frequency measurement unit 5 stores the calibration coefficient. A known load impedance Zm=Rm+jXm is then measured, for example at the center frequency fo of the first frequency range W1. Meanwhile, an impedance Zm is calculated based on the proper voltage RMS value Vm, current RMS value Im, and phase difference θm output by the high-frequency measurement unit 5. Finally, an error between the measured known impedance and the calculated impedance is checked.

To be more detailed, in the measurement system shown in FIG. 3, the load impedance Zm=Rm+jXm at the center frequency fo in the first frequency range W1 of the dummy load 6 is measured. Then the high-frequency measurement unit 1 outputs the high-frequency power of the frequency fo. In response thereto, the high-frequency measurement unit 5 measures the voltage RMS value Vm, the current RMS value Im, and the phase difference θm. The resistance Rm' and the reactance Xm' of the load impedance can be calculated through the following formula:

$$R'_m = \left(\frac{V_m}{I_m}\right)\cos\theta_m,$$

$$X'_m = \left(\frac{V_m}{I_m}\right)\sin\theta_m.$$

The error between the load impedance Zm'=Rm'+jXm' thus obtained and the known load impedance Zm=Rm+jXm is checked.

Accordingly, the calibration coefficients actually measured only at the upper and lower frequency of the frequency range may be retained only when the desired calibration accuracy can be achieved, and the linear interpolation may be employed for acquiring the calibration coefficients with respect to other frequencies.

Here, in the foregoing embodiment, the second frequency range W2 has the fluctuation range of 0.68 MHz (0.05%) with respect to the center frequency fo=13.56 MHz, and since the ratio of the fluctuation range against the center frequency fo is quite small, the linearity of the calibration coefficient can be considered to be sufficiently secured, in the second frequency range W2. Therefore, the foregoing calibration method is quite effective.

Meanwhile, since the first frequency range W1 has the fluctuation range of 0.2 MHz (10%) with respect to the center frequency fo=2.0 MHz, the ratio of the fluctuation range against the center frequency fo is relatively great. Accordingly, in the first frequency range W1 or in a frequency range with respect to a center frequency lower than 2.0 MHz, the linearity of the calibration coefficient cannot be sufficiently secured, and hence undesirable inaccuracy in calibration may be revealed upon reviewing the calibration accuracy as above. In such a case, an actually measured calibration coefficient may be prepared, for example with respect to the center frequency fo of the frequency range. Then, with respect to a frequency fp in the frequency range between the center frequency fo and the lower limit frequency fmin, a calibration coefficient Cp may be calculated by the linear interpolation between the calibration coefficient Co at the center frequency fo and the calibration coefficient Cmin at the lower limit frequency fmin. Likewise, with respect to a frequency between the center frequency fo and the upper limit frequency fmax, a calibration coefficient Cq may be calculated by the linear interpolation between the calibration coefficient at the center frequency and the calibration coefficient Cmax at the upper limit frequency. Thus, the frequency range may be divided into a plurality of regions, to calculate the calibration coefficient by the linear interpolation in each region.

Although the high-frequency measurement unit 5 is located on the side of the output terminal 3b inside the impedance matching device 3 according to the foregoing embodiment, the high-frequency measurement unit 5 may be located on the input side inside the impedance matching device 3, or provided as an independent measurement unit.

Also, the high-frequency measurement unit is granted with the function of measuring all of the voltage, current, and phase of the high-frequency wave in the foregoing embodiment. However, the present invention is not limited to such arrangement, but the high-frequency measurement unit may be designed to solely measure the voltage or the current of the high-frequency wave.

Further, the detected value and the calibration coefficient are multiplied for obtaining the true measured value in the foregoing embodiment. However, without limitation to such method, summation or other types of calculations may also be incorporated.

Figure 9:
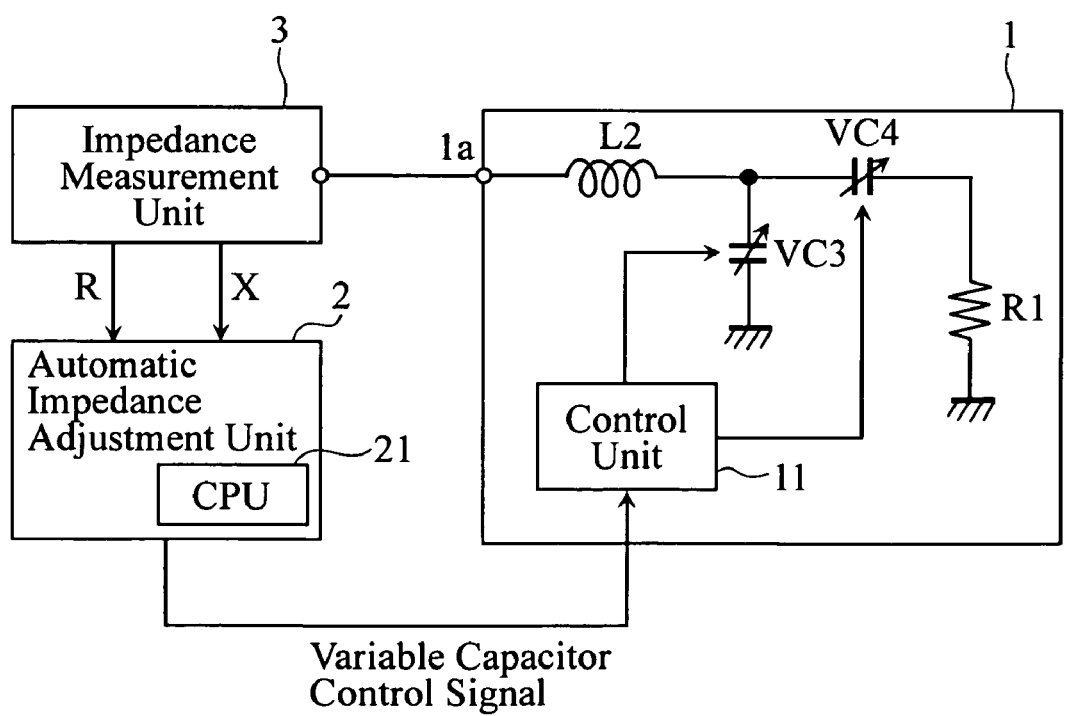
FIG. 9 is a block diagram of an impedance adjustment system according to the present invention.

FIG. 9 is a block diagram of an impedance adjustment system according to the present invention. The impedance adjustment system serves to set a predetermined load impedance ZL in the dummy load 1, and more specifically, to automatically optimize the adjustment position C3, C4 of the variable capacitors VC3, VC4 provided in the dummy load 1. The impedance adjustment system includes the dummy load 1, an automatic impedance adjustment unit 2, and an impedance measurement unit 3. Out of those, the automatic impedance adjustment unit 2 corresponds to the electrical characteristic adjustment apparatus of the present invention.

The dummy load 1 serves to simulate the processing unit included in the plasma processing system. The dummy load 1 includes the variable capacitors VC3, VC4. Each of the variable capacitors VC3, VC4 is an air variable capacitor, and has a pair of electrodes opposing each other. One of the electrodes is a movable electrode that rotates about a shaft perpendicular to the plane of the electrode. Rotation of the movable electrode causes a change in opposing area of the electrodes, thereby varying the capacitance of the variable capacitor. The shaft supporting the movable electrode is connected to an electric motor such as a stepping motor, which rotates the movable electrode. With such mechanism, the capacitance of the variable capacitor VC3 or VC4 can be varied, for example, in 1000 steps. Each step is given a position number of 0 to 1000. The control unit 11 retains a table including the respective position numbers and corresponding stepping motor driving data, to set a desired capacitance. In this case, the dummy load 1 can set a million (1000×1000=1,000,000) values of impedance at maximum.

The automatic impedance adjustment unit 2 serves to control the overall impedance adjustment system, and includes a personal computer or the like. The automatic impedance adjustment unit 2 receives an input of an impedance value Z=R+jX of the dummy load 1 from the impedance automatic measurement unit 3, and outputs a control signal for adjusting the variable capacitor to the dummy load 1. Also, the automatic impedance adjustment unit 2 retains a target impedance value Zo=Ro+jXo, input in advance by the user. The automatic impedance adjustment unit 2 calculates an index called an error evaluation value E, which will be described later, from the measured impedance Z and the target impedance Zo. The automatic impedance adjustment unit 2 adjusts the variable capacitors VC3, VC4 to minimize the error evaluation value E. As a result, the impedance Z of the dummy load 1 comes closer to the target impedance Zo. Details of such impedance adjustment will be subsequently described.

The impedance measurement unit 3 serves to measure the load impedance of the dummy load 1. The impedance measurement unit 3 is connected to an input terminal 1a of the dummy load. The impedance measurement unit 3 is a so-called impedance analyzer, which measures a voltage applied to the dummy load 1 and a current running in the dummy load 1 to thereby calculate the impedance Z=R+jX, as well as the real part R and the imaginary part X thereof, and to transmit such values to the automatic impedance adjustment unit 2.

The impedance measurement unit 3 has the function of sweeping a predetermined frequency range for measurement. For example, when 801 measuring points are provided in a range of 12 MHz to 13 MHz at regular intervals, the impedance measurement unit 3 changes the frequency by 1.25 kHz (=(13−12)×1000/800) for performing the impedance measurement. Likewise, when 101 measuring points are provided in a range of 12 MHz to 13 MHz at regular intervals, the impedance measurement unit 3 changes the frequency by 10 kHz (=(13−12)×1000/100) for performing the impedance measurement.

Each time the frequency range to be swept or the number of measurement points is changed, the calibration has to be redone. Accordingly, a broad frequency range is set, in order to simplify the calibration operation as much as possible. For accurately searching a broader frequency range, a greater number of measurement points have to be provided. In this case, however, the measurement becomes redundant and consumes a longer time per round in the measurement. This method is, therefore, not suitable for an algorithm such as the golden section method. In this embodiment, accordingly, the search is executed in two stages, namely a broad-range search and a precise search. In the broad-range search, a fewer number of measurement points (101 points) are measured for rough evaluation. In the precise search, the maximal measurable points (801 points) are measured, to evaluate with higher accuracy.

The automatic impedance adjustment unit 2 performs the impedance adjustment, i.e. brings the impedance Z of the dummy load 1 measured by the impedance measurement unit 3 closer to the target impedance Zo, through the following steps.

The automatic impedance adjustment unit 2 calculates the index called the error evaluation value E, through the following formula. The error evaluation value E represents a magnitude of difference between Z and Zo.

$$E = \sqrt{\frac{a(R_0 - R)^2 + b(X_0 - X)^2 +}{c[deviationR]^2 + d[deviationX]^2}} \quad (4)$$

where: a, b, c, d: weighting coefficient for evaluation,
deviationR: deviation of R from the tolerance of Ro,
deviationX: deviation of X from the tolerance of Xo.

The tolerance means a range of values that can be regarded as having substantially reached the target, and is expressed as Ro±N % for example. The amount of deviation means a deviation from the tolerance. For example, it will be assumed that the tolerance of the target value Ro is 100±1%, i.e. 99 to 101. In this case, the amount of deviation of R=100.5 is 0, and the amount of deviation of R=97.8 is 1.2 (=99−97.8). The third and the fourth term of the formula (4) respectively include a relatively large coefficient c, d. For example, a and b are 1, while c and d are 1000. Accordingly, when either of the measured values R, X is deviated from the tolerance, the error evaluation value E becomes a large value.

For obtaining a minimal value of the evaluation value E, the golden section method is employed.

Figure 10A:
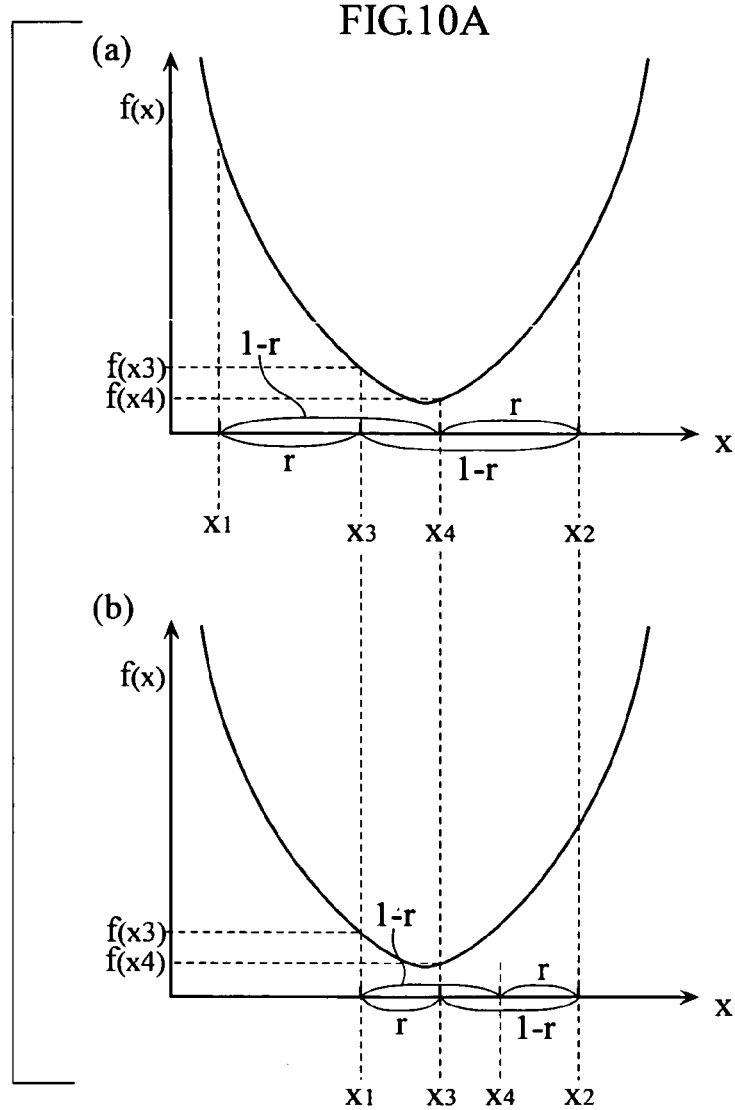
FIGS. 10A to 10C are graphs for explaining a golden section method.
Figures 10B, 10C:
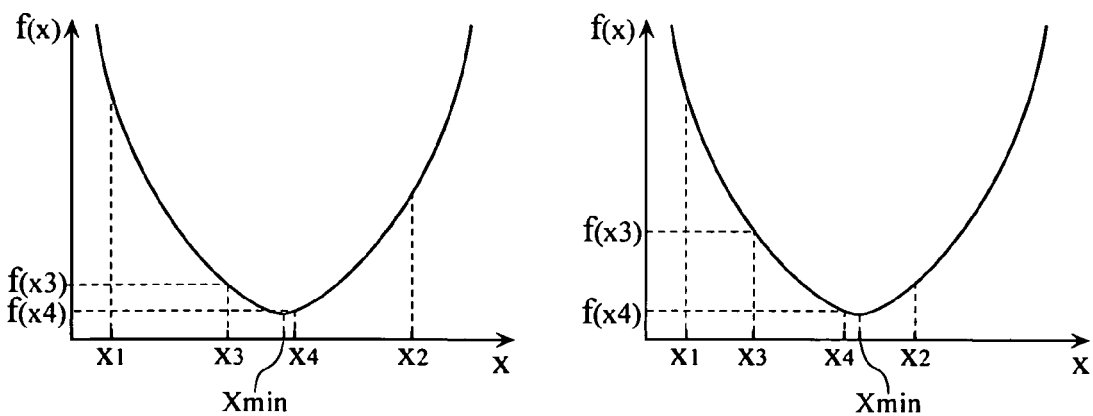

FIGS. 10A to 10C are graphs for explaining a golden section method. The golden section method is used to search a minimal value or maximal value in a predetermined range x1<x<x2 of a single-peak function f(x) such as a second order function. Firstly as shown in FIG. 10A(a), the range is divided by a point x3 and a point x4. The x3 internally divides the range from x1 to x2 as r: (1−r). The x4 internally divides the range from x1 to x2 as (1−r):r. Then f(x3) and f(x4) are compared. In the case of f(x3)>f(x4), xmin corresponding to the minimal value f(xmin) exists within the range of x3<x<x2 (to be more detailed, xmin is either in the range of x3<x<x4 as shown in FIG. 10B, or in the range of x4<x<x2 as shown in FIG. 10C). Accordingly, in the next step, x3 is regarded as an updated x1, and a similar process is performed. In the case of f(x3)<f(x4), xmin corresponding to the minimal value f(xmin) exists within the range of x1<x<x4. In the next step, accordingly, x4 is regarded as an updated x2, and a similar process is performed. Such process is repeated, so that when the searching range from x1 to x2 becomes sufficiently small, f(x3), f(x4), and f(xmin), which are nearly equal to one another, may be regarded as the minimal value.

Now, on the assumption that r equals to $(3-\sqrt{5})/2$, a so-called golden ratio of r:(1−r)=1:$(1+\sqrt{5})/2$ is achieved. In this case, a point that internally divides the range of x3 to x2 as r: (1−r) in FIG. 10A(a) coincides with x4. Accordingly, upon updating x3 as the new x1 as shown in FIG. 10A(b), the internal division point x3 of the next step coincides with x4 of the preceding step. The golden section method has, therefore, the advantage that the new f(x3) can be calculated more quickly.

The golden section method can perform the optimization in the first dimension. However, since this embodiment involves two variable capacitors VC3, VC4, the optimization has to be executed in the second dimension constituted of the adjustment positions C3, C4, in this embodiment.

Accordingly, the golden section method is utilized as follows, in this embodiment. Firstly the adjustment position of the variable capacitor VC3 is fixed. Then the adjustment position of the variable capacitor VC4 is optimized by the golden section method such that the error evaluation value E becomes minimal. Hereinafter, such process will be referred to as "one search session" with respect to the adjustment position of VC4. In this process, X largely changes and R slightly changes.

Then the adjustment position of VC4 is fixed. The golden section method is carried out to optimize the adjustment position of VC3 such that the error evaluation value E becomes minimal. In other words, a search session of the adjustment position of VC3 is performed. In this process, R largely changes and X slightly changes.

Thereafter, the search of the adjustment position of VC4 and that of VC3 are alternately repeated, to identify the adjustment position that provides the minimal error evaluation value E.

It is experientially known that, when changing the adjustment position of one of the variable capacitors VC3, VC4 with that of the other fixed, the error evaluation value E calculated with the formula (4) constitutes a single-peak function. Therefore, the golden section method is applicable.

As described above, the automatic impedance adjustment unit 2 fixes one of the variable capacitors VC3, VC4 of the dummy load 1, and searches the adjustment position that makes the error evaluation value E minimal. The automatic impedance adjustment unit repeats such searches, thereby adjusting the impedance Z of the dummy load 1 to bring the impedance Z into the tolerance of the target impedance Zo.

Description will now be given on how the search range for the adjustment position of VC3 and VC4, in other words the range corresponding to the initial range x1<x<x2 shown in FIG. 10A(a), is to be determined.

The adjustment position of VC3 identified upon completing the (n−1)th search of the adjustment position of VC3 will be expressed as C3n−1. In the n-th search of the adjustment position of VC3, the automatic impedance adjustment unit 2 searches a range having a "search amplitude" R3n including the C3n−1 at its center. In other words, the searching range of the adjustment position C3n of VC3 at the n-th search can be expressed by the following formula:

$$C3_{n-1} - R3_n \leq C3_n \leq C3_{n-1} + R3_n \quad (5)$$

Likewise, the adjustment position of VC4 identified upon completing the (n−1)th search of the adjustment position of VC4 will be expressed as C4n−1. In the n-th search of the adjustment position of VC4, the automatic impedance adjustment unit 2 searches a range having a "search amplitude" R4n including the C4n−1 at its center. In other words, the searching range of the adjustment position C4n of VC4 at the n-th search can be expressed by the following formula:

$$C4_{n-1} - R4_n \leq C4_n \leq C4_{n-1} + R4_n \quad (6)$$

To reduce the time necessary for identifying the minimal value, the width of the search amplitude R3n, R4n for the adjustment positions C3, C4 is changed in each search session. This is because the following drawback is incurred in the case where the search amplitude is equally set in each session. When the search amplitude is wide, it takes longer time to perform a search session, while in the case where the search amplitude is narrow a greater number of search sessions have to be performed before identifying the minimal value. If the search amplitude is widely set when the adjustment position of the variable capacitor obtained upon completing the preceding search session is relatively close to the adjustment position corresponding to the minimal value of the error evaluation value E, time is wasted for executing unnecessary search. If, on the contrary, the search amplitude is narrowly set when the adjustment position of the variable capacitor obtained upon completing the preceding search session is relatively far from the adjustment position corresponding to the minimal value of the error evaluation value E, the search has to be performed over an excessive number of times.

For such reason, it is preferable to change the search amplitude for each search session in a range from a predetermined lower limit value (R3min, R4min to be described later) to a predetermined upper limit value (R3max, R4max to be described later). The search amplitude R3n for the n-th search of the adjustment position of VC3 can be expressed by the following formula:

$$R3_n = \begin{cases} R3_{max} & (R3_{max} < V3 \times |C3_{n-1} - C3_{n-2}|) \\ V3 \times |C3_{n-1} - C3_{n-2}| & (R3_{min} < V3 \times |C3_{n-1} - C3_{n-2}| \le R3_{max}) \\ R3_{min} & (V3 \times |C3_{n-1} - C3_{n-2}| < R3_{min}) \end{cases} \quad (7)$$

where R3min represents the lower limit value of R3n, and R3max the upper limit value of R3n. The coefficient V3 is 2 in this embodiment.

Further, the search amplitude R4n for the n-th search of the adjustment position of VC4 can be expressed by the following formula:

$$R4_n = \begin{cases} R4_{max} & (R4_{max} < V4 \times |C4_{n-1} - C4_{n-2}|) \\ V4 \times |C4_{n-1} - C4_{n-2}| & (R4_{min} < V4 \times |C4_{n-1} - C4_{n-2}| \le R4_{max}) \\ R4_{min} & (V4 \times |C4_{n-1} - C4_{n-2}| < R4_{min}) \end{cases} \quad (8)$$

where R4 min represents the lower limit value of R4n, and R4max the upper limit value of R4n. The coefficient V4 is 2 in this embodiment.

Now, description will be given on how the initial value of the adjustment positions C3, C4 in the search is to be determined.

The automatic impedance adjustment unit 2 includes a storage device. In the storage device, two types of information are stored. First information is records of preceding measurements, and second information is a database.

The first information, i.e. the records of preceding measurements, includes the following. When using the automatic impedance adjustment unit 2, each time the impedance of the dummy load 1 is adjusted to the target impedance Zo, that impedance Zo and values of the adjustment positions C3, C4 used to attain the impedance Zo are recorded.

The second information, database, includes the following. The discrete values of the adjustment positions C3, C4 and the corresponding measured values of impedance are stored in advance as database.

To adjust the impedance of the dummy load 1 to the target impedance Zo in the use of the automatic impedance adjustment unit 2, either the first or the second information stored in the storage device is retrieved, to be used as the initial value for the adjustment position. The status of the dummy load at the time of using the automatic impedance adjustment unit 2 may be different from the status at the time that the first and the second information were acquired in advance. Accordingly, utilizing the retrieved value may not result in accurately attaining the target impedance Zo. However, it is certain that at least an impedance close to Zo can be attained, and hence the subsequent adjustment can be completed in a significantly short time.

Figure 11:
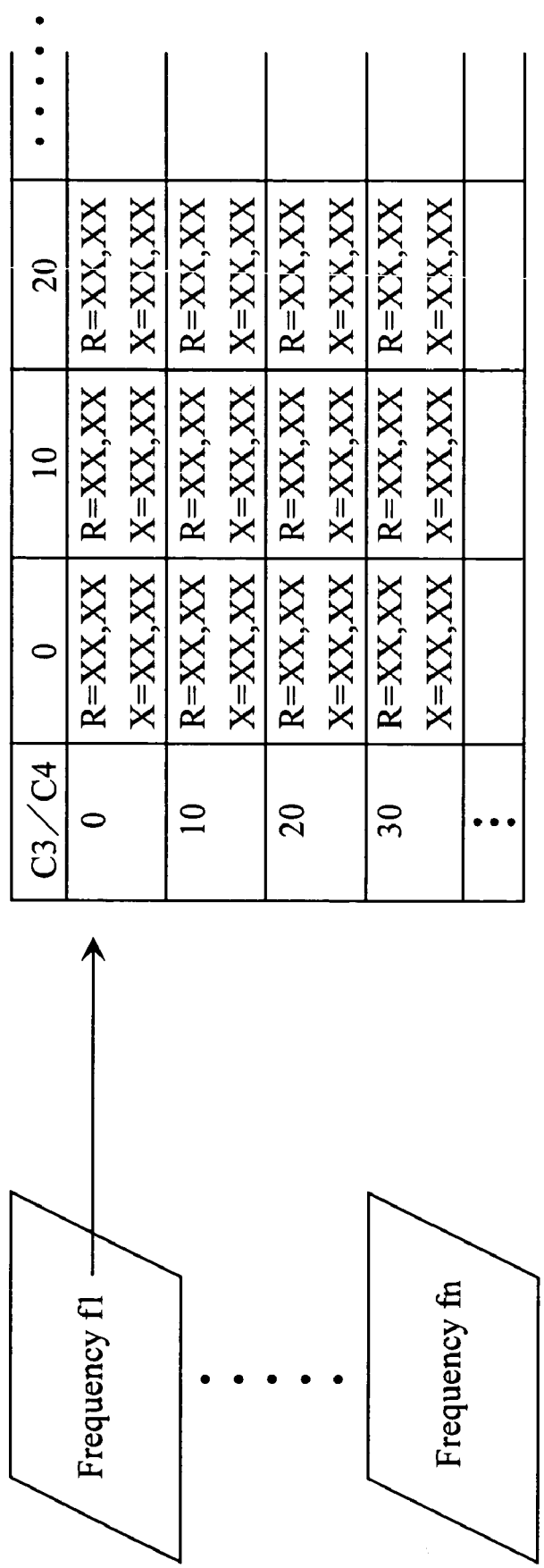
FIG. 11 is a diagram showing a database stored in a storage device of an automatic impedance adjustment unit.

FIG. 11 depicts the second information, i.e. the database stored in a storage device of the automatic impedance adjustment unit. The database includes the values of the impedance Z=R+jX of the dummy load 1 corresponding to various combinations of the adjustment positions C3 and C4 of the variable capacitors VC3 and VC4, with respect to each frequency employed (for example, 13.56 MHz and 2.0 MHz).

The initial value of the adjustment position is selected out of the database through the following process. Firstly, the impedance data in the database corresponding to the frequency closest to the target frequency is substituted in the formula (4) one by one, and the error evaluation value E is calculated in each case. Then the smallest error evaluation value E is identified. Finally the data of the adjustment positions C3, C4 corresponding to the smallest error evaluation value E is identified. Such adjustment positions are selected as the one that attains the impedance closest to the target impedance Zo.

Figure 12:
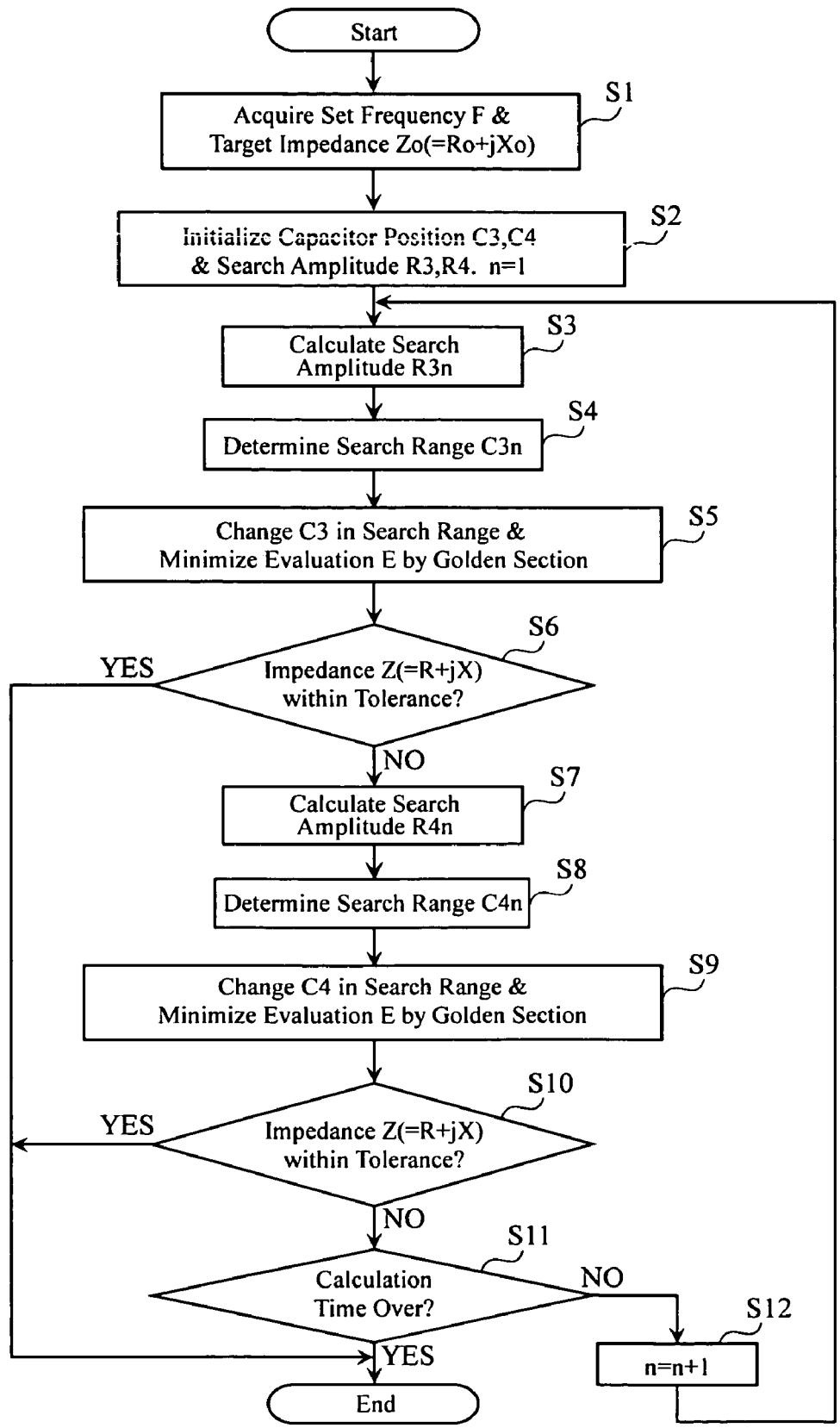
FIG. 12 is a flowchart showing a control process performed by the automatic impedance adjustment unit for adjusting the impedance of a dummy load to the target impedance.

FIG. 12 is a flowchart showing a control process performed by the automatic impedance adjustment unit 2 for adjusting the impedance of the dummy load 1 to the target impedance Zo.

To start with, the frequency F and the target impedance Zo (=Ro+jXo) to be attained are input (S1). The adjustment positions C3, C4 of VC3, VC4 and the search amplitude R3, R4 are initialized, and the search session counter n is set at 1 (S2). Here, the initialization of C3, C4 is performed as follows. In the case where the information on the adjustment positions C3, C4 corresponding to the target impedance Zo is available in the foregoing "records of preceding measurements", that information is utilized as the initial value of C3, C4. If the information on the adjustment positions C3, C4 corresponding to the target impedance Zo is unavailable in the foregoing "records of preceding measurements", a value selected out of the database stored in the storage device, or an arbitrary value is employed as the initial value. In the initialization of R3, R4, the predetermined lower limit values R3min, R4min are employed as the initial value of R3, R4 respectively.

Then C3 is adjusted by the golden section method, with C4 fixed (S3 to S5). Specifically, the search amplitude R3n is first calculated with the formula (7) (S3). Then the searching range is determined based on the formula (5) (S4). Finally, C3 is changed within the searching range according to the golden section method, to calculate the minimal error evaluation value E, to thereby acquire the C3 and the impedance Z that attain the minimal error evaluation value E (S5).

It is then decided whether the identified impedance Z is within the tolerance (S6). IF the impedance Z is outside of the tolerance (S6: NO), C3 is now fixed and C4 is adjusted by the golden section method (S7 to S9). Specifically, the search amplitude R4n is first calculated with the formula (8) (S7). Then the searching range is determined based on the formula (6) (S8). Finally, C4 is changed within the searching range according to the golden section method, to calculate the minimal error evaluation value E, to thereby acquire the C4 and the impedance Z that attain the minimal error evaluation value E (S9).

It is then decided whether the identified impedance Z is within the tolerance (S10). IF the impedance Z is outside of the tolerance (S10: NO), it is decided whether the calculation time has exceeded a predetermined value (S11). In the negative case (S11: NO), 1 is added to the search session counter n (S12) and the process returns to the step S3. If affirmative (S11: YES), it is concluded that the impedance adjustment cannot be achieved and the control is finished.

On the other hand, if the obtained impedance Z is within the tolerance (S10: YES), the adjustment of the dummy load 1 to the target impedance Zo is completed, and the control is finished.

Thus, the automatic impedance adjustment unit 2 automatically adjusts the adjustment position of the two variable capacitors in the dummy load, thereby quickly setting the predetermined impedance in the dummy load.

That is how the automatic impedance adjustment unit 2 works. The automatic impedance adjustment unit 2 is employed for setting a plurality of impedance values in a predetermined range, in the dummy load. However, without limitation to such use, the present invention is applicable to various other systems that operate a plurality of adjustment units to automatically adjust a measured value to a target value.

Figure 13:
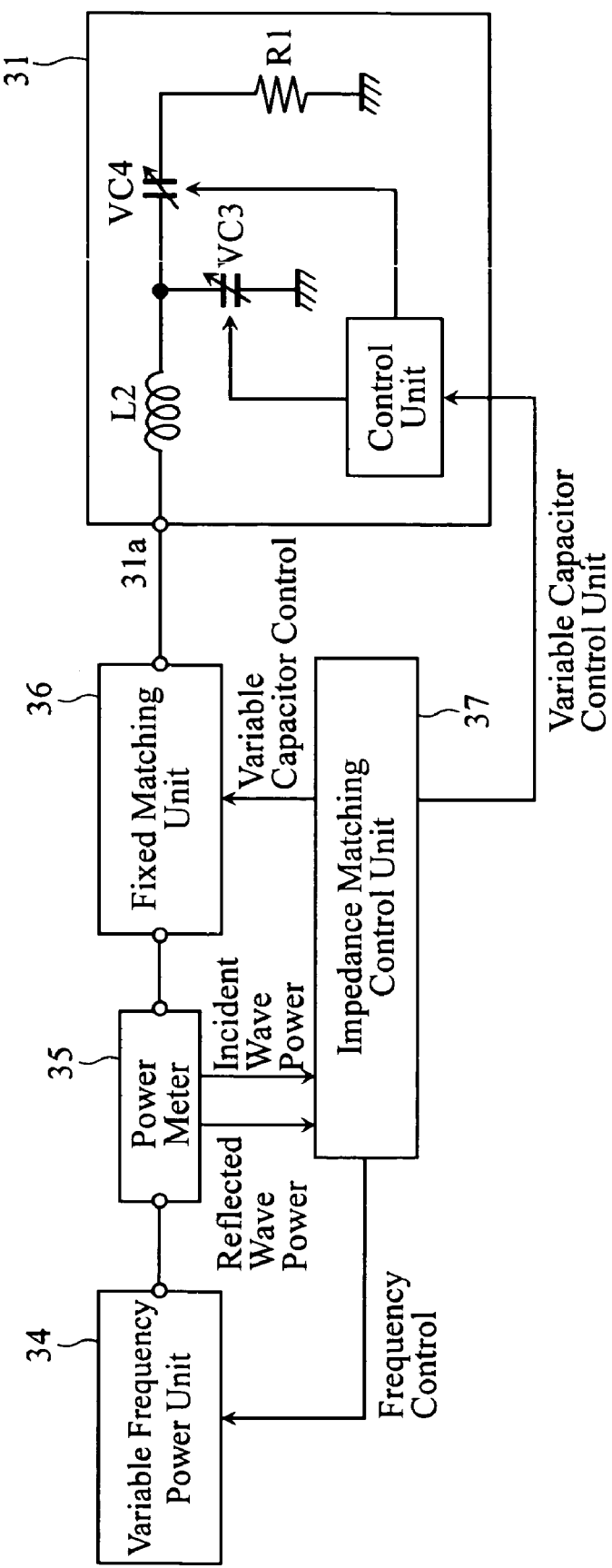
FIG. 13 is a block diagram of an impedance matching system according to the present invention.
Figure 14:
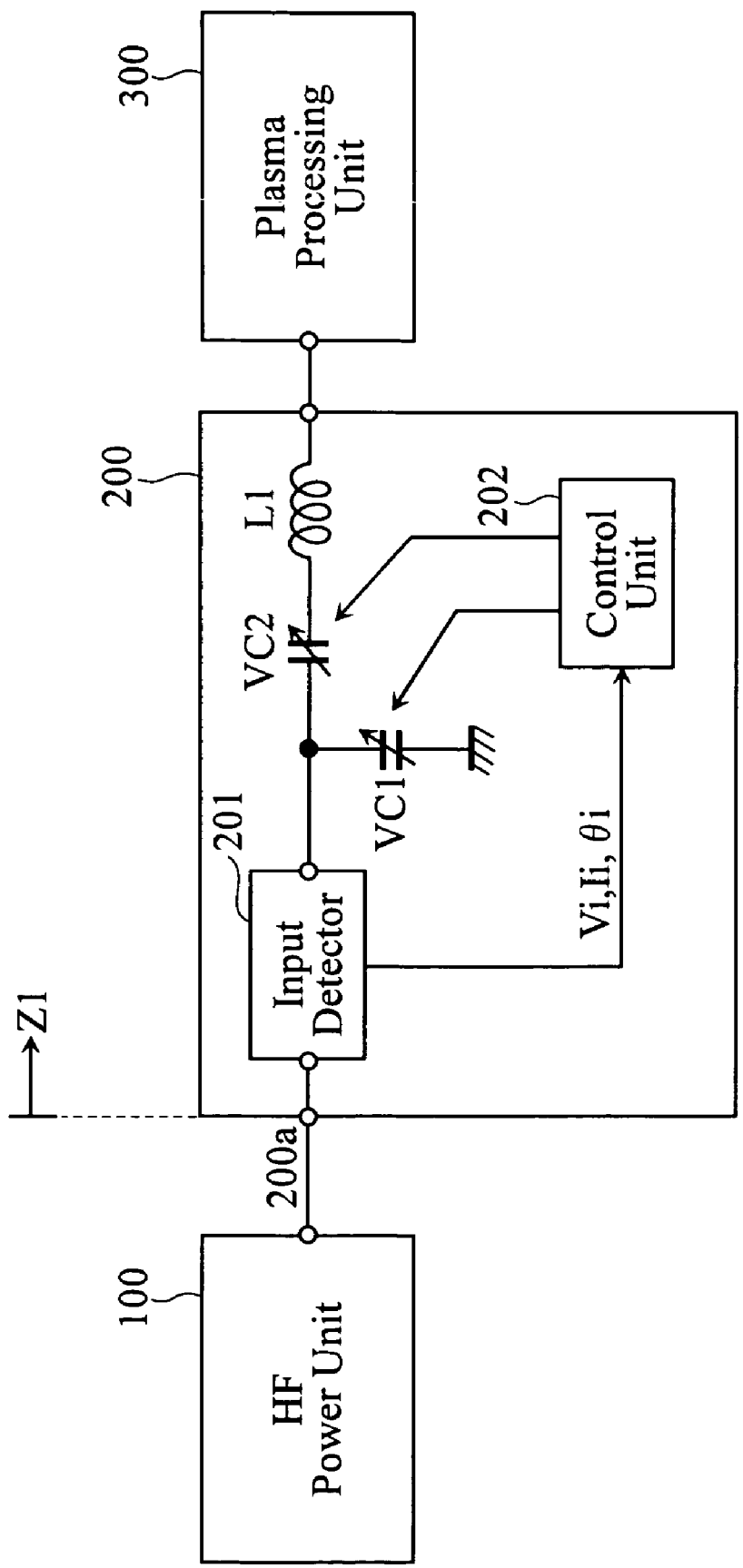
FIG. 14 is a block diagram of another typical plasma processing system.
Figure 15:
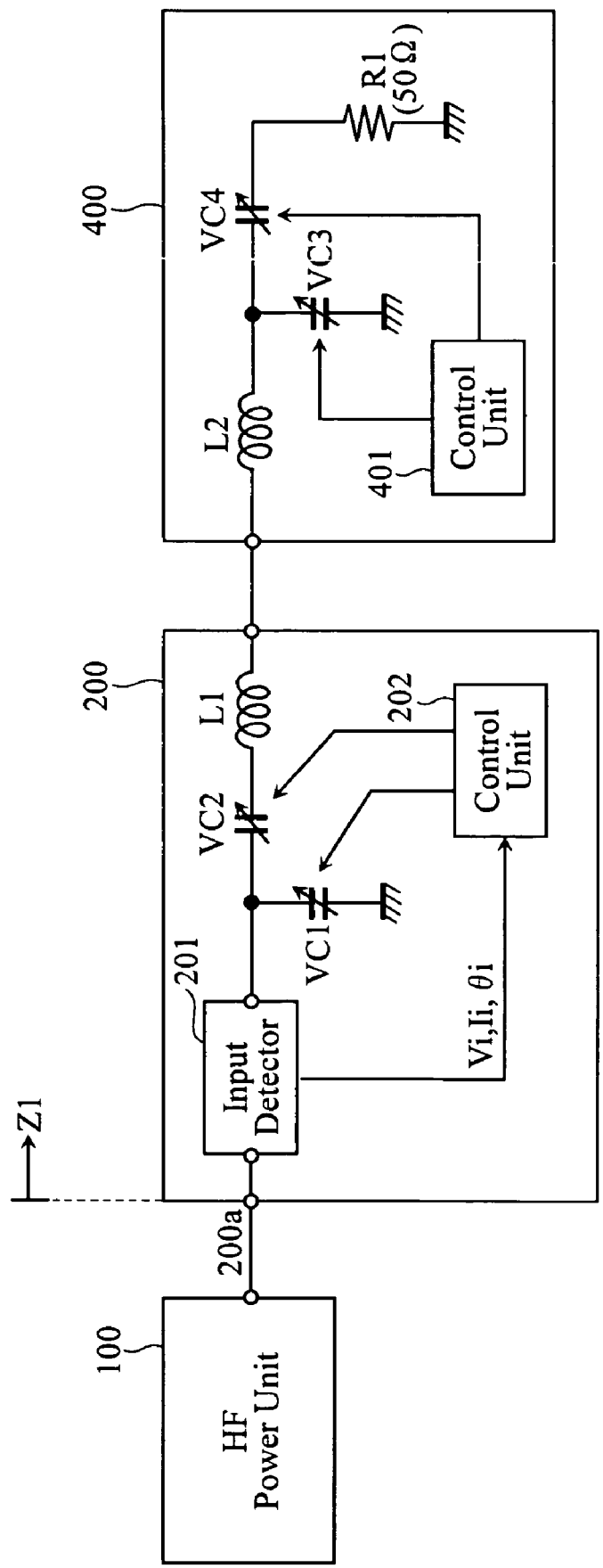
FIG. 15 is a block diagram of a system for examining the operation of an impedance matching unit with the dummy load.

FIG. 13 illustrates an impedance matching system according to another embodiment of the present invention. The impedance matching system serves to examine under which conditions the impedance matching unit can achieve the impedance matching, prior to the actual use of the plasma processing unit included in the plasma processing system.

The impedance matching system includes a dummy load 31, a variable frequency power unit 34, a power meter 35, a fixed matching unit 36, and an impedance matching control unit 37.

During the plasma processing by the plasma processing system, the impedance of the plasma processing unit dynamically fluctuates. To follow up such fluctuation thus to maintain the impedance matching, the system employs the variable frequency power unit 34. The variable frequency power unit 34 is capable of changing the frequency of the output power, and the frequency is controlled by the impedance matching control unit 37. The frequency of the output fluctuates in a range of fo±Δf. Here, fo represents the center frequency.

The power meter 35 measures an incident wave power generated by the variable frequency power unit 34, and a reflected wave power directed to the variable frequency power unit 34.

The fixed matching unit 36 serves to follow up the fluctuation of the load impedance, to match the impedance of the variable frequency power unit 34 with the load impedance. The fixed matching unit 36 is of a similar structure to that of the foregoing impedance matching unit, but includes a capacitor with a fixed capacitance, in place of the variable capacitor VC2. Accordingly, the fixed matching unit 36 includes a variable capacitor. The adjustment position of this variable capacitor is controlled by the impedance matching control unit 37. The variable capacitor also serves to follow up the dynamic fluctuation of the impedance during the plasma processing, to thereby maintain the impedance matching.

The impedance matching control unit 37 calculates a reflection coefficient (=reflected wave power/incident wave power) based on a measured value of the incident wave power and a measured value of the reflected wave power provided by the power meter 35, and further automatically adjusts the adjustment position of the variable capacitor of the fixed matching unit 6 and the output frequency of the variable frequency power unit 34, such that the error evaluation value between the calculated reflection coefficient and a predetermined target reflection coefficient becomes minimal.

The impedance matching control unit 37 adjusts the two variable capacitors VC3, VC4 in the dummy load 31, thereby setting the impedance of the dummy load 31. Also, the impedance matching control unit 37 receives the measured value of the incident wave power and the reflected wave power from the power meter 35, and calculates the reflection coefficient. The impedance matching control unit 37 further adjusts the adjustment position of the variable capacitor in the fixed matching unit 34, and the output frequency of the variable frequency power unit 34, to make the error evaluation value minimal, between the target reflection coefficient and the calculated reflection coefficient minimal.

As may be understood, the adjustment method according to this embodiment is similar to that of the embodiment described referring to FIG. 9. The "incident wave power and reflected wave power", "error evaluation value of the reflection coefficient", and "adjustment position of the variable capacitor in the fixed matching unit 36, and output frequency of the variable frequency power unit 34" in this embodiment respectively correspond to the "real part R and imaginary part X of the impedance Z=R+jX", "error evaluation value E", and "adjustment positions C3, C4" of the embodiment of FIG. 9. The impedance matching control unit 37 fixes one of the adjustment position of the variable capacitor in the fixed matching unit 36, and output frequency of the variable frequency power unit 34, and searches the other based on the golden section method. The impedance matching control unit 37 then repeats the search until the reflection coefficient enters the tolerance, to optimize the adjustment position of the variable capacitor in the fixed matching unit, and the output frequency of the variable frequency power unit 34. Here, since the variable frequency power unit 34 executes automatic impedance matching, the output frequency obtained through the automatic matching is employed as the initial value. As the initial value of the adjustment position of the variable capacitor in the fixed matching unit 36, an arbitrary value is employed.

When the output frequency of the variable frequency power unit 34 is varied under control, the impedance of the dummy load 31 also follows up the variation. When the impedance of the dummy load 31 has to be kept from changing, the impedance matching control unit 37 may change only the adjustment position of the variable capacitor in the fixed matching unit 36, without changing the output frequency of the variable frequency power unit 34. When employing a high-frequency power unit that does not change the output frequency instead of the variable frequency power unit 34 shown in FIG. 13, the foregoing impedance matching unit may be employed in place of the fixed matching unit 36, to thereby automatically adjust the two variable capacitors.

In the embodiment shown in FIG. 9, the automatic adjustment unit changes the adjustment position of the two variable capacitors, to thereby adjust two measured values, namely the real part R and the imaginary part X of the impedance Z. However, without limitation to such arrangement, three or more values may be varied or measured. When three or more values are to be measured, the automatic impedance adjustment unit may calculate the error evaluation value based on those values, and further fix one of the values to be changed and adjust the remaining values, to thereby minimize the error evaluation value. Then such process may be repeated.

In the foregoing embodiment, the adjustment is completed upon attaining the minimal error evaluation value. However, without limitation to such arrangement, a calculation formula that allows completing the adjustment when the error evaluation value becomes maximal may be employed.

The invention claimed is:

1. A high-frequency measurement unit for measuring a high-frequency signal in a predetermined frequency range, the unit comprising:
   a signal detector that detects the high-frequency signal;
   a calibration coefficient storage unit that stores calibration coefficients Cmin and Cmax used for calibrating a detected value Amin and a detected value Amax to a proper measurement value Asmin and a proper measurement value Asmax respectively, the value Amin being detected by the signal detector at a lower limit frequency fmin of the frequency range, the value Amax being detected by the signal detector at an upper limit frequency fmax of the frequency range;
   a frequency detection unit that detects a frequency fm of the high-frequency signal detected by the signal detector;
   a calibration coefficient calculation unit that calculates a calibration coefficient Cm for the frequency fm, the calculation being based on the lower limit frequency fmin and the upper limit frequency fmax of the frequency range, the frequency fm detected by the frequency detection unit, and the calibration coefficients Cmin and Cmax stored in the calibration coefficient storage unit; and
   a measured value calibration unit that calibrates the value Am detected by the signal detector to a proper measurement value Asm, the calibration being based on the calibration coefficient Cm calculated by the calibration coefficient calculation unit;
   wherein the signal detector includes a voltage detection unit for detection of a high-frequency voltage signal and a current detection unit for detection of a high-frequency current signal,
   wherein the calibration coefficient storage unit stores voltage calibration coefficients Cvmin, Cvmax and current calibration coefficients Cimin, Cimax, the voltage calibration coefficients Cvmin and Cvmax being used for calibrating a detected value Vmin of the high-frequency voltage signal at the lower limit frequency fmin of the frequency range and a detected value Vmax of the high-frequency voltage signal at the upper limit frequency fmax of the frequency range to a proper measurement value VSmin and a proper measurement value VSmax respectively, the current calibration coefficients Cimin and Cimax being used for calibrating a detected value Imin of the high-frequency current signal at the lower limit frequency fmin of the frequency range and a detected value Imax of the high-frequency current signal at the upper limit frequency fmax to a proper measurement value ISmin and a proper measurement value ISmax respectively,
   wherein the calibration coefficient calculation unit calculates a voltage calibration coefficient Cvm for the frequency fm detected by the frequency detection unit, the calculation being based on the lower limit frequency fmin and the upper limit frequency fmax of the frequency range, the frequency fm, and the voltage calibration coefficients Cvmin, Cvmax stored in the calibration coefficient storage unit, the calibration coefficient calculation unit also calculating a current calibration coefficient Cim for the frequency fm based on the lower limit frequency fmin, the upper limit frequency fmax, the frequency fm, and the current calibration coefficients Cimin, Cimax stored in the calibration coefficient storage unit, and
   wherein the measured value calibration unit calibrates a detected value Vm of the high-frequency voltage signal detected by the voltage detection unit to a proper voltage measurement value VSm, the calibration being based on the voltage calibration coefficient Cvm calculated by the calibration coefficient calculation unit, the measured value calibration unit also calibrating a detected value Im of the high-frequency current signal detected by the current detection unit to a proper current measurement value ISm, the calibration being based on the current calibration coefficient Cim calculated by the calibration coefficient calculation unit.

2. The high-frequency measurement unit according to claim 1, wherein the calibration coefficient calculation unit calculates the calibration coefficient Cm by the following formula:

$$C_m = C_{min} + (f_m - f_{min})(C_{max} - C_{min})/(f_{max} - f_{min}).$$

3. The high-frequency measurement unit according to claim 1, further comprising a phase detection unit that detects a phase of the high-frequency signal based on the high-frequency voltage signal detected by the voltage detection unit and the high-frequency current signal detected by the current detection unit,
   wherein the calibration coefficient storage unit further stores phase calibration coefficients Cdmin, Cdmax used for calibrating a phase difference θmin at the lower limit frequency fmin and a phase difference θmax at the upper limit frequency fmax to a proper phase difference θSmin and a proper phase θSmax respectively, the phase differences θmin and θmax being detected by the phase detection unit,
   wherein the calibration coefficient calculation unit calculates a phase calibration coefficient Cdm for the frequency fm based on the lower limit frequency fmin, the upper limit frequency fmax, the frequency fm detected by the frequency detection unit, and the phase calibration coefficients Cdmin, Cdmax stored in the calibration coefficient storage unit,
   wherein the measured value calibration unit calibrates a phase difference θm detected by the phase detection unit to a proper phase difference θm, the calibration being based on the phase calibration coefficient Cdm calculated by the calibration coefficient calculation unit.

4. The high-frequency measurement unit according to claim 3, wherein the voltage calibration coefficients Cvmin and Cvmax are average values of a plurality of voltage calibration coefficients acquired by changing an output of the high-frequency signal in a predetermined range, the current calibration coefficients Cimin, Cimax being average values of a plurality of current calibration data acquired by changing an output of the high-frequency signal in the predetermined range, the phase calibration coefficients Cdmin and Cdmax being average values of a plurality of phase calibration coefficients acquired by changing an output of the high-frequency signal in the predetermined range.

5. The high-frequency measurement unit according to claim 1, wherein the measurement of the high-frequency signal is performed with respect to at least two discrete frequency ranges that are apart from each other.

6. An electrical characteristic adjustment apparatus that automatically adjusts an electrical characteristic value of a device to a predetermined target characteristic value, the device including a plurality of circuit elements having a variable electrical characteristic value, a plurality of actuators each associated with a corresponding one of the circuit elements for changing the characteristic value of the corresponding element, and a drive controller for controlling operation of the actuators, the adjustment apparatus comprising:
- a characteristic value acquisition unit that acquires the characteristic value of the device through a measurement unit for measuring the characteristic value;
- a characteristic value variation unit that sets one of the plurality of circuit elements as a variable element and the rest as fixed elements, and that causes the drive controller to change the characteristic value of the variable element in a predetermined range;
- a circuit element adjustment unit that calculates, through a predetermined formula, an error evaluation value for evaluating an error between the characteristic value acquired by the characteristic value acquisition unit and the target characteristic value, the calculation being performed each time the characteristic value of the variable element is changed by the characteristic value variation unit, the circuit element adjustment unit also calculating a characteristic value of the variable element that minimizes the error evaluation value; and
- an adjustment control unit that repeats a predetermined process until the characteristic value obtained by the characteristic value acquisition unit falls in a tolerance of the target characteristic value, the predetermined process including steps of: sequentially switching the plurality of circuit elements to a current variable element, with the characteristic value of the circuit element switched last to a variable element fixed at the characteristic value obtained by the circuit element adjustment unit; causing the characteristic value variation unit to change the characteristic value of the current variable element; and causing the circuit element adjustment unit to perform adjustments of the circuit elements;
- wherein the characteristic value variation unit discretely changes the characteristic value of the circuit element as the variable element in the predetermined range in accordance with a golden section method.

7. The electrical characteristic adjustment apparatus according to claim 6, wherein the characteristic value variation unit includes a range setting unit that sets a fluctuation range within which the characteristic value of each circuit element as the variable element is to be changed, the fluctuation range being based on a previous variation in the characteristic value of the variable element.

8. An electrical characteristic adjustment apparatus that automatically adjusts an electrical characteristic value of a device to a predetermined target characteristic value, the device including a plurality of circuit elements having a variable electrical characteristic value, a plurality of actuators each associated with a corresponding one of the circuit elements for changing the characteristic value of the corresponding element, and a drive controller for controlling operation of the actuators, the adjustment apparatus comprising:
- a characteristic value acquisition unit that acquires the characteristic value of the device through a measurement unit for measuring the characteristic value;
- a characteristic value variation unit that sets one of the plurality of circuit elements as a variable element and the rest as fixed elements, and that causes the drive controller to change the characteristic value of the variable element in a predetermined range;
- a circuit element adjustment unit that calculates, through a predetermined formula, an error evaluation value for evaluating an error between the characteristic value acquired by the characteristic value acquisition unit and the target characteristic value, the calculation being performed each time the characteristic value of the variable element is chanced by the characteristic value variation unit, the circuit element adjustment unit also calculating a characteristic value of the variable element that minimizes the error evaluation value; and
- an adjustment control unit that repeats a predetermined process until the characteristic value obtained by the characteristic value acquisition unit falls in a tolerance of the target characteristic value, the predetermined process including steps of: sequentially switching the plurality of circuit elements to a current variable element, with the characteristic value of the circuit element switched last to a variable element fixed at the characteristic value obtained by the circuit element adjustment unit; causing the characteristic value variation unit to change the characteristic value of the current variable element; and causing the circuit element adjustment unit to perform adjustments of the circuit elements;
- wherein the characteristic value acquired by the characteristic value acquisition unit is an impedance value of the device, the circuit element adjustment unit being configured to calculate the error evaluation value through the following formula:

$$E = \sqrt{a(R_0 - R)^2 + b(X_0 - X)^2 + c[deviationR]^2 + d[deviationX]^2},$$

where a, b, c, d: weighting coefficient for evaluation,
R: resistance component of the acquired impedance,
Ro: resistance component of the target impedance,
X: reactance component of the acquired impedance,
Xo: reactance component of the target impedance,
deviationR: deviation of R from the tolerance of Ro,
deviationX: deviation of X from the tolerance of Xo.

9. The electrical characteristic adjustment apparatus according to claim 8, wherein the device is a simulative load including two reactance elements with a variable reactance value for the plurality of circuit elements.

10. The electrical characteristic adjustment apparatus according to claim 8, wherein the device is an impedance matching unit including two reactance elements with a variable reactance value as a plurality of circuit elements,
wherein the measurement unit includes a first power measurement unit for measuring an incident wave power of the impedance matching unit, and a second power measurement unit for measuring a reflected wave power of the impedance matching unit,
wherein the circuit element adjustment unit calculates, through a predetermined formula, a reflection coefficient based on the incident wave power and the reflected wave power obtained by the characteristic value acquisition unit, the circuit element adjustment unit being configured to calculate the characteristic value of the variable element based on an error evaluation value that evaluates an error between the reflection coefficient and a predetermined target reflection coefficient.

* * * * *